(12) United States Patent
Ishikawa et al.

(10) Patent No.: US 11,063,143 B2
(45) Date of Patent: Jul. 13, 2021

(54) INSULATED-GATE SEMICONDUCTOR DEVICE AND METHOD OF MANUFACTURING THE SAME

(71) Applicant: FUJI ELECTRIC CO., LTD., Kawasaki (JP)

(72) Inventors: Takamasa Ishikawa, Matsumoto (JP); Noriaki Yao, Matsumoto (JP); Seiji Noguchi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/773,465

(22) Filed: Jan. 27, 2020

(65) Prior Publication Data

US 2020/0287029 A1 Sep. 10, 2020

(30) Foreign Application Priority Data

Mar. 5, 2019 (JP) ................. JP2019-39933

(51) Int. Cl.
*H01L 29/739* (2006.01)
*H01L 29/66* (2006.01)
*H01L 29/423* (2006.01)
*H01L 29/40* (2006.01)

(52) U.S. Cl.
CPC ........ *H01L 29/7397* (2013.01); *H01L 29/407* (2013.01); *H01L 29/4236* (2013.01); *H01L 29/66348* (2013.01)

(58) Field of Classification Search
CPC ............... H01L 29/7397; H01L 29/407; H01L 29/4236; H01L 29/66348
USPC ........................................................ 257/139
See application file for complete search history.

(56) References Cited

U.S. PATENT DOCUMENTS

| 2017/0162458 | A1 | 6/2017 | Onozawa | |
| 2018/0082996 | A1* | 3/2018 | Naito | .................. H01L 29/0804 |
| 2018/0108738 | A1* | 4/2018 | Naito | .................. H01L 29/1095 |
| 2018/0182754 | A1* | 6/2018 | Naito | .................. H01L 29/8613 |
| 2018/0366578 | A1* | 12/2018 | Naito | ................ H01L 29/66348 |

FOREIGN PATENT DOCUMENTS

| JP | 2010-50211 A1 | 3/2010 |
| JP | 2011-40781 A1 | 2/2011 |
| JP | 6304445 B | 3/2018 |

* cited by examiner

*Primary Examiner* — Igwe U Anya

(57) ABSTRACT

A method of manufacturing an insulated-gate semiconductor device includes: digging a dummy trench and digging a gate trench so as to have a U-like shape in a planar pattern to surround the dummy trench into the U-like shape; forming a dummy electrode and a gate electrode in the dummy trench and the gate trench via a gate insulating film; forming a projection for testing connected to the dummy electrode via an opening of the U-like shape and a wiring layer for testing; and testing an insulating property of the gate insulating film in the dummy trench by applying a voltage between the wiring layer for testing and a charge transport region.

11 Claims, 15 Drawing Sheets

INSULATED-GATE SEMICONDUCTOR DEVICE AND METHOD OF MANUFACTURING THE SAME

CROSS-REFERENCE TO RELATED APPLICATION

This application claims benefit of priority under 35 USC 119 based on Japanese Patent Application No. 2019-039933 filed on Mar. 5, 2019, the entire contents of which are incorporated by reference herein.

BACKGROUND OF THE INVENTION

1. Field of the Invention

The present invention relates to an insulated-gate semiconductor device having a trench gate structure and a method of manufacturing the insulated-gate semiconductor device.

2. Description of the Related Art

Insulated-gate bipolar transistors (IGBT) having a trench gate structure are known that have a configuration in which a dummy electrode is buried in a part of a plurality of trenches (in a dummy trench), and is electrically connected to an emitter electrode so as to reduce a capacitance between a gate and a collector causing switching loss.

JP 6304445 B (Patent Document 1) discloses a method of collectively screening out defective gate insulating films laminated in all of the trenches before gate trenches and dummy trenches are separated from each other in terms of a device configuration, so as to keep the quality of the gate insulating films in the dummy trenches. JP 2010-50211 A1 (Patent Document 2) discloses a method of connecting dummy trenches and an emitter electrode via contact holes to screen out defective gate insulating films in the dummy trenches so as to keep the quality of the gate insulating films in the dummy trenches. JP 2011-40781 A1 (Patent Document 3) discloses an insulated-gate semiconductor device including stripe-shaped trenches, in which the respective pairs of the adjacent trenches are connected to each other at the respective ends so as to have a shape delineated with a single stroke.

The method disclosed in Patent Document 1 conducts the screening test for the gate insulating films in all of the trenches at the same time. This test needs to use a relatively large level of voltage to be applied during the test, producing a large amount of particles when defective devices are broken. To decrease the amount of particles, the conditions of the screening could be changed depending on the resistance necessary for the gate insulating films in the dummy trenches. However, such a change further requires an additional screening test for the gate insulating films in the gate trenches after the manufacturing process ends, resulting in a reduction in resistance to time-dependent dielectric breakdown (TDDB) of the gate insulating films. If the screening is canceled after the completion of the manufacturing process, the incidence of damage caused in the rest of the process after the first screening cannot be screened out.

The method disclosed in Patent Document 2, which conducts the screening test for the gate insulating films in the dummy trenches independently of the gate trenches, evaluates the insulating properties via the contact holes, which complicate the configuration to increase the number of photolithography steps. Patent Document 3 fails to disclose a method of screening the gate insulating films in the dummy trenches.

SUMMARY OF THE INVENTION

In response to the above issue, the present invention provides an insulated-gate semiconductor device and a method of manufacturing the insulated-gate semiconductor device capable of screening out defects of a gate insulating film in a dummy trench, independently of a gate insulating film in a gate trench, while avoiding an increase in the number of steps.

An aspect of the present invention inheres in an insulated-gate semiconductor device, encompassing: a charge transport region of a first conductivity-type; an injection control region of a second conductivity-type provided on the charge transport region; a main charge supply region of the first conductivity-type selectively provided on the injection control region; a dummy electrode buried, via a gate insulating film, in a dummy trench penetrating the main charge supply region and the injection control region to reach the charge transport region; a gate electrode buried, via the gate insulating film, in a gate trench having at least one U-like shape in a planar pattern adjacent to the dummy trench to surround the dummy trench into the U-like shape, and having a depth identical to a depth of the dummy trench; a gate surface wiring layer connected to the gate electrode at a bottom portion of the U-like shape; and a connection land formed of a conductive layer connected to the dummy electrode, and selectively deposited on an opening side of the U-like shape.

Another aspect of the present invention inheres in a method of manufacturing an insulated-gate semiconductor device, encompassing: forming an injection control region of a second conductivity-type on a charge transport region of a first conductivity-type; forming a main charge supply region of the first conductivity-type on the injection control region; digging a dummy trench so as to penetrate the main charge supply region and the injection control region to reach the charge transport region, and digging a gate trench so as to have a U-like shape in a planar pattern adjacent to the dummy trench to surround the dummy trench into the U-like shape; burying a conductive film in the dummy trench via a gate insulating film to serve as a dummy electrode, and burying a conductive film in the gate trench via the gate insulating film to serve as a gate electrode; forming a projection for testing connected to the dummy electrode via an opening of the U-like shape, and forming a wiring layer for testing connected to the projection for testing; and testing an insulating property of the gate insulating film in the dummy trench by applying a voltage between the wiring layer for testing and a bottom surface of the charge transport region.

DETAILED DESCRIPTION

Figure 1:
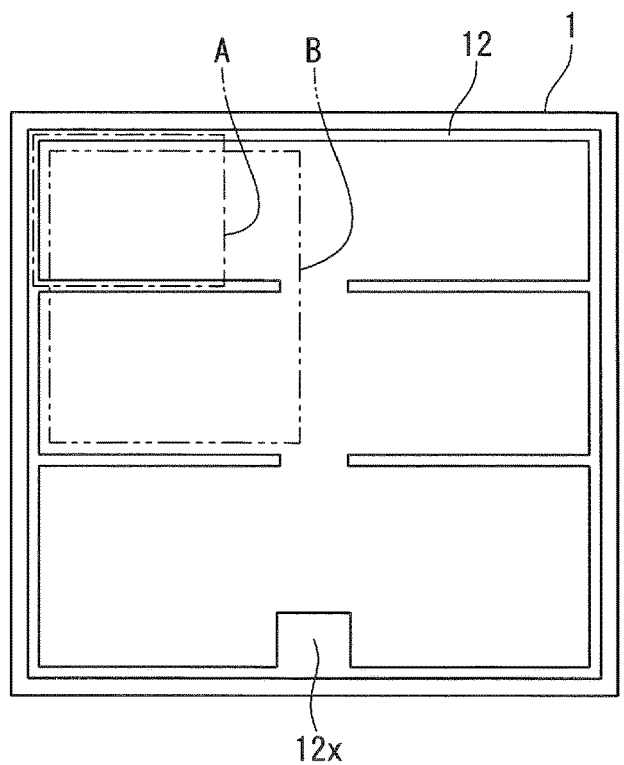
FIG. 1 is a plan view illustrating an insulated-gate semiconductor device according to an embodiment.

With reference to the Drawings, embodiments of the present invention will be described below. In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions.

In the Specification, a "main charge supply region" of the insulated-gate semiconductor device means a region which supplies carriers as a main current. The main charge supply region is assigned to a semiconductor region which will be an emitter region or a collector region in an insulated-gate bipolar transistor (IGBT), a source region or a drain region in a metal-insulator-semiconductor field-effect transistor (MISFET) or a metal-insulator-semiconductor static induction transistor (MISSIT), and an anode region or a cathode region in a metal-insulator-semiconductor thyristor such as a MIS control static induction (SI) thyristor. A "main charge reception region" means a region which receive majority carriers as a main current. The main charge reception region is assigned to a semiconductor region which will not be the main charge supply region and will be the source region or the drain region in the MISFET or the MIS SIT, the emitter region or the collector region in the IGBT, and the anode region or the cathode region in such as the MIS control SI thyristor. Note that there is a case that minority carriers, which have charges opposite to majority carries as a main current, are supplied from the main charge reception region in a semiconductor device such as IGBT performing a bipolar operation.

That is, when the main charge supply region is the source region, the main charge reception region means the drain region. The main current flow between the main charge supply region and the main charge reception region. For example, the main current is assigned to a collector current in IGBT. When the main charge supply region is the emitter region, the main charge reception region means the collector region. When the main charge supply region is the anode region, the main charge reception region means the cathode region. In such as MISFET, a function of the main charge supply region and a function of the main charge reception region are exchangeable each other by exchanging a bias relationship. An electrode which is electrically connected to the main charge supply region by such as ohmic contact is defined as a "main charge supply electrode". An electrode which is electrically connected to the main charge reception region by such as ohmic contact is defined as a "main charge reception region". A plug for connection or a silicide layer may be provided between the main charge supply region and the main charge supply electrode or between the main charge reception region and the main charge reception electrode.

Further, in the following description, there is exemplified a case where a first conductivity type is an n-type and a second conductivity type is a p-type. However, the relationship of the conductivity types may be inverted to set the first conductivity type to the p-type and the second conductivity type to the n-type. Further, a semiconductor region denoted by the symbol "n" or "p" attached with "+" indicates that such semiconductor region has a relatively high impurity concentration as compared to a semiconductor region denoted by the symbol "n" or "p" without "+". A semiconductor region denoted by the symbol "n" or "p" attached with "−" indicates that such semiconductor region has a relatively low impurity concentration as compared to a semiconductor region denoted by the symbol "n" or "p" without "−". However, even when the semiconductor regions are denoted by the same reference symbols "n" and "n", it is not indicated that the semiconductor regions have exactly the same impurity concentration.

Further, definitions of directions such as an up-and-down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

<Insulated-Gate Semiconductor Device>

An insulated-gate semiconductor device according to the embodiment is illustrated below with an IGBT having a trench gate structure. The insulated-gate semiconductor device according to the embodiment may be a reverse-conducting IGBT (RC-IGBT) including an IGBT and a freewheeling diode (FWD) integrated in a single chip.

As illustrated in FIG. 1, the insulated-gate semiconductor device according to the embodiment includes a semiconductor substrate (semiconductor chip) 1 as a base having a rectangular shape in a planar pattern, for example. A gate pad 12x and a gate surface wiring layer (gate runner) 12 connected to the gate pad 12x are deposited on the semiconductor substrate 1. The gate surface wiring layer 12 is electrically connected to a gate electrode of the IGBT. FIG. 1 omits some elements, such as an interlayer insulating film, a main charge supply electrode (emitter electrode), and a passivation film to be deposited on the semiconductor substrate 1.

Figure 2:
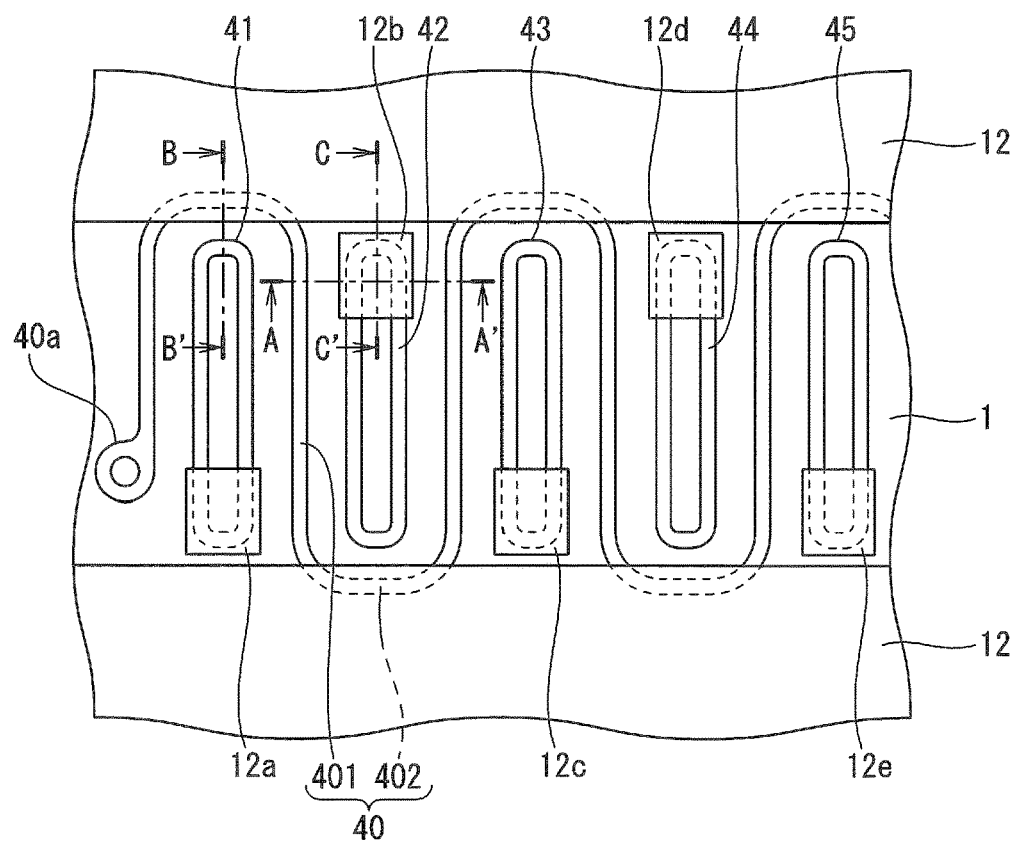
FIG. 2 is an enlarged plan view of an area A in FIG. 1.

FIG. 2 is an enlarged schematic plan view of an area A illustrated in FIG. 1 defined by the dash-dotted line. As illustrated in FIG. 2, the insulated-gate semiconductor device according to the embodiment includes a first trench (gate trench) 40, and second trenches (dummy trenches) 41, 42, 43, 44, and 45. FIG. 2 schematically indicates, by the broken lines for illustration purposes, part of the gate trench 40 located under the gate surface wiring layer 12, and part of the respective dummy trenches 41 to 45 located under upper-layer connection lands 12a, 12b, 12c, 12d, and 12e.

The dummy trenches 41 to 45 each have a flat O-like shape in a planar pattern in which paired stripes extending in parallel are connected together at each end via a circular arc. The paired stripes connected to the circular arcs at both ends in the respective dummy trenches 41 to 45 extend parallel to each other. The stripes of the dummy trenches 41 to 45 are arranged continuously in the direction perpendicular to the extending direction. The number and the width as a planar dimension of the dummy trenches 41 to 45, and the length and the aspect ratio of the stripes may be determined as appropriate.

The gate trench 40 surrounds the three sides of the respective dummy trenches 41 to 45 into a U-like shape in a planar pattern. The gate trench 40 has a topology of a meandering line in a planar pattern in which the respective U-like shapes are alternately inverted and connected to each other. The gate trench 40 is delineated into the meandering line in the planar pattern such that stripes 401 extend between the dummy trenches 41 to 45 alternately in the opposite directions.

The gate trench 40 includes the stripes 401 extending parallel to the respective stripes of the dummy trenches 41 to 45, and connecting parts 402 located on either side so as to alternately connect the adjacent stripes 401 extending in the opposite directions to each other on the corresponding side. The connecting parts 402 have a U-like shape in a planar pattern including an arc-like portion connecting the stripes 401 of the gate trench 40 adjacent to each other extending in the opposite directions. The U-shaped connecting parts 402 are arranged alternately inversely so as to connect the adjacent stripes 401 to each other toward the upper or lower side of the respective dummy trenches 41 to 45. The connecting parts 402 each correspond to the bottom of the U-like shape.

The "U-like" shape of the gate trench 40 in the planar pattern may be a square U-like shape, instead of the form of the letter "U" of the alphabet. The "U-like" shape as used herein is only required to be open at least on one side. For example, the gate trench 40 may have a shape with the corners rounded off in which a horizontal part on each of the upper and lower sides of the respective dummy trenches 41 to 45 is connected to the stripes via junction parts having an angle of 45 degrees. While the topology illustrated in FIG. 2 only includes a circular end portion 40a of the gate trench 40 on the left side, the right side also has the same circular end portion (not illustrated). The width of a planar dimension of the gate trench 40 and the length of the stripes 401, for example, may be determined as appropriate. The width of the gate trench 40 may be either the same as or different from the width of the respective dummy trenches 41 to 45.

FIG. 2 illustrates both the gate surface wiring layer 12 extending in the horizontal direction to cover the connecting parts 402 on the upper side of the gate trench 40 in the planar pattern, and the gate surface wiring layer 12 extending in the horizontal direction to cover the connecting parts 402 on the lower side of the gate trench 40. Although not illustrated, the gate surface wiring layer 12 is deposited on the gate trench 40 in cross section vertical to the main surface of the semiconductor chip. The upper-layer connection lands 12a to 12e are provided separately from the gate surface wiring layer 12 and cover the end portions of the respective dummy trenches 41 to 45 on either side toward the opening of the respective U-like shapes of the gate trench 40 in the planar pattern illustrated in FIG. 2. The gate surface wiring layer 12 and the upper-layer connection lands 12a to 12e are conductive layers made of polysilicon (doped polysilicon: DOPOS) to which impurity ions such as phosphorus (P) are doped at a high concentration.

Figure 3:
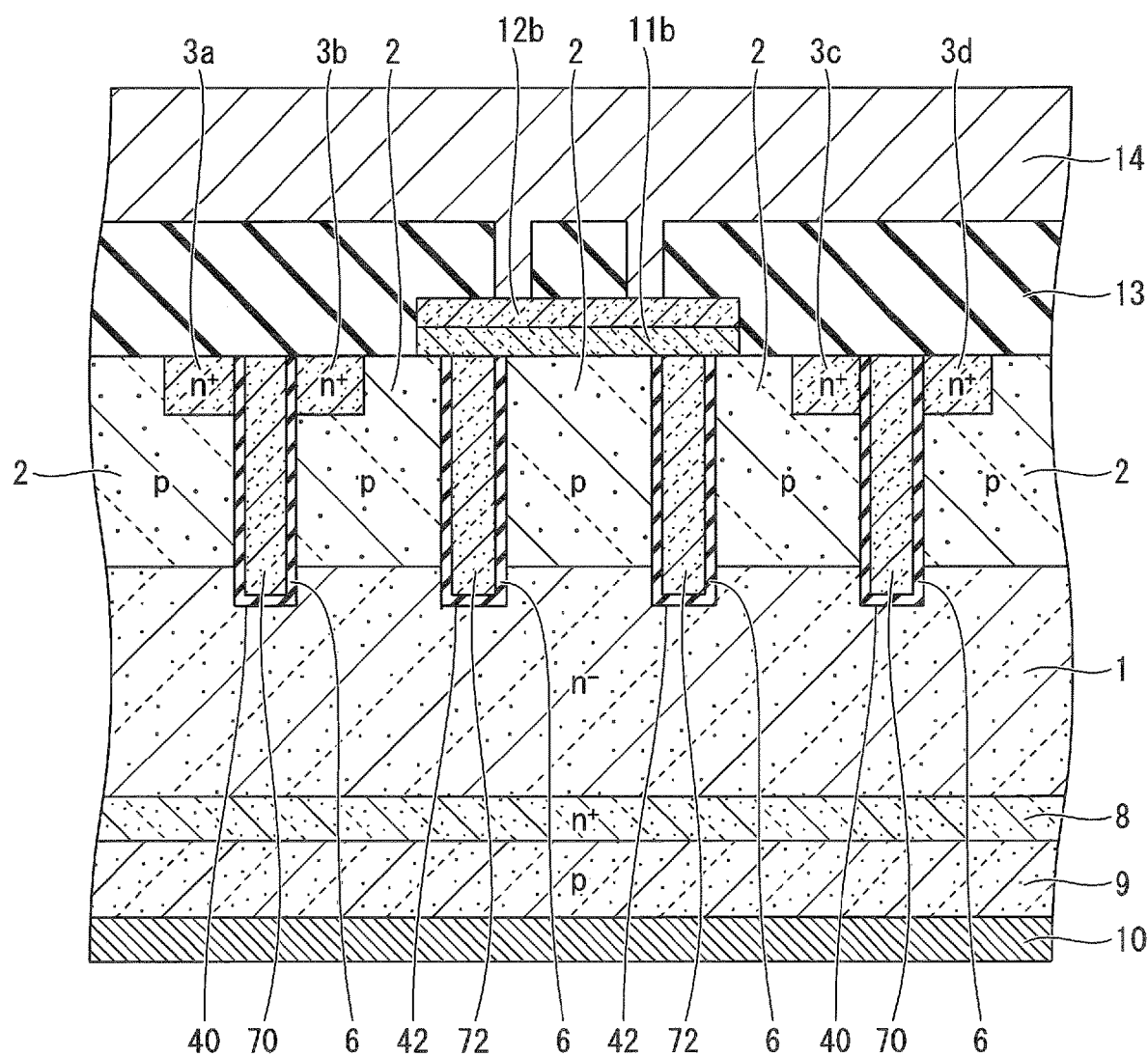
FIG. 3 is a cross-sectional view as viewed from direction A-A' in FIG. 2

FIG. 3 is a cross-sectional view as viewed from direction A-A' in FIG. 2. As illustrated in FIG. 3, the insulated-gate semiconductor device according to the embodiment includes a charge transport region (drift region) 1 of a first conductivity-type ($n^-$-type). The charge transport region 1 is a semiconductor region capable of transporting charge carriers (electrons) as a main current by a drift electric field. An injection control region (base region) 2 of a second conductivity-type (p-type) is deposited on an upper part of the charge transport region 1. The injection control region 2 is a semiconductor region which controls the amount of the charge carriers to be injected to the charge transport region 1. Main charge supply regions (emitter regions) 3a, 3b, 3c, and 3d of $n^+$-type having a higher impurity concentration than the charge transport region 1 are provided in an upper portion of the injection control region 2.

Although not illustrated in FIG. 3, contact regions of the second conductivity-type ($p^+$-type) in contact with the main charge supply regions 3a to 3d may be provided in the upper portion of the injection control region 2. For example, the main charge supply regions 3a to 3d and the contact regions may be continuously and alternately arranged parallel to the extending direction of the stripes 401 of the gate trench 40 illustrated in FIG. 2.

As illustrated in FIG. 3, the dummy trench 42 and the gate trench 40 penetrate into the top surface of the main charge supply regions 3a to 3d through the injection control region 2 to reach an upper portion of the charge transport region 1. The dummy trench 42 and the gate trench 40 have substantially the same depth, for example.

The dummy trench 42 and the gate trench 40 are provided with gate insulating films 6 laminated on bottom and side surfaces. Examples of films used as the gate insulating films 6 include a silicon oxide ($SiO_2$) film, a silicon oxynitride (SiON) film, a strontium oxide (SrO) film, a silicon nitride ($Si_3N_4$) film, an aluminum oxide ($Al_2O_3$) film, a magnesium oxide (MgO) film, an yttrium oxide ($Y_2O_3$) film, a hafnium oxide ($HfO_2$) film, a zirconium oxide ($ZrO_2$) film, a tantalum oxide ($Ta_2O_5$) film, a bismuth oxide ($Bi_2O_3$) film, and a composite film including two or more of these films stacked on one another.

The gate insulating film 6 laminated on the side surface of the gate trench 40 serves as a gate film which statically controls a surface potential of the injection control region 2 immediately under the main charge supply regions 3a to 3d to form channels on the surface of the injection control region 2 facing the side surface of the gate trench 40. The gate insulating films 6 laminated on the dummy trenches 41 to 45 do not serve as a gate film. The gate insulating films 6 in the dummy trenches 41 to 45, however, still need to ensure reliability of resistance to time-dependent dielectric breakdown (TDDB) behavior, as in the case of the gate insulating film 6 in the gate trench 40, since an electric field also crows at the bottom portions of the dummy trenches 41 to 45. The reliability of the resistance to the TDDB can be enhanced by voltage application so as to screen out defects, such as an abnormality in shape of the dummy trenches 41 to 45 and the gate trench 40, and quality-degradation of the insulating films 6 inserted between the respective dummy trenches 41 to 45 and gate trench 40 and the electrodes.

A dummy electrode 72 is buried in the dummy trench 42 illustrated in FIG. 3 via the gate insulating film 6. The other dummy trenches 41, and 43 to 45 illustrated in FIG. 2 have the same structure as the dummy trench 42. A gate electrode 70 is buried in the gate trench 40 via the gate insulating film 6. A material used for the dummy electrode 72 and the gate electrode 70 can be DOPOS.

An interlayer insulating film 13 is deposited on the gate electrode 70. Examples of films used as the interlayer insulating film 13 include a high temperature oxide (HTO) film, and a non-doped silicon oxide ($SiO_2$) film without including phosphorus (P) or boron (B), which is referred to as non-doped silicate glass (NSG). Other examples of films used as the interlayer insulating film 13 include a phosphosilicate glass (PSG) film, a borosilicate glass (BSG) film, a borophosphosilicate glass (BPSG) film, and a silicon nitride ($Si_3N_4$) film.

A main charge supply electrode (emitter electrode) 14 is deposited on the interlayer insulating film 13. The main charge supply electrode 14 is electrically or metallurgically connected to the main charge supply regions 3a to 3d via contact holes open in the interlayer insulating film 13 at positions in front of the sheet of the drawing not illustrated in FIG. 3. The main charge supply electrode 14 is provided separately from the gate surface wiring layer 12 located at a position on the back side of the sheet of the drawing not illustrated in FIG. 3.

The dummy electrode 72 has a function of reducing a capacitance between the gate and the collector causing switching loss, for example. A lower-layer connection land 11b and the upper-layer connection land 12b are provided on the dummy electrode 72. The lower-layer connection land 11b and the upper-layer connection land 12b are semiconductor layers made of DOPOS, for example. A material used for the lower-layer connection land 11b and the upper-layer connection land 12b may be either the same or different from each other.

The upper-layer connection land 12b has a rectangular shape in a planar pattern, as illustrated in FIG. 2. Although not illustrated in FIG. 2, the lower-layer connection land 11b under the upper-layer connection land 12b has substantially the same rectangular shape in the planar pattern as the upper-layer connection land 12b. The other connection lands having the same rectangular shape in the planar pattern as the lower-layer connection land 11b are also provided under the upper-layer connection lands 12a and 12c to 12e having the same rectangular shape in the planar pattern as the upper-layer connection land 12b.

The dummy electrode 72 illustrated in FIG. 3 is electrically connected to the main charge supply electrode 14 via the contact holes open in the interlayer insulating film 13 over the lower-layer connection land 11b and the upper-layer connection land 12b. The dummy electrode 72, which does not contribute to the formation of the channels, is electrically insulated and separated from the gate surface wiring layer 12.

Figure 4:
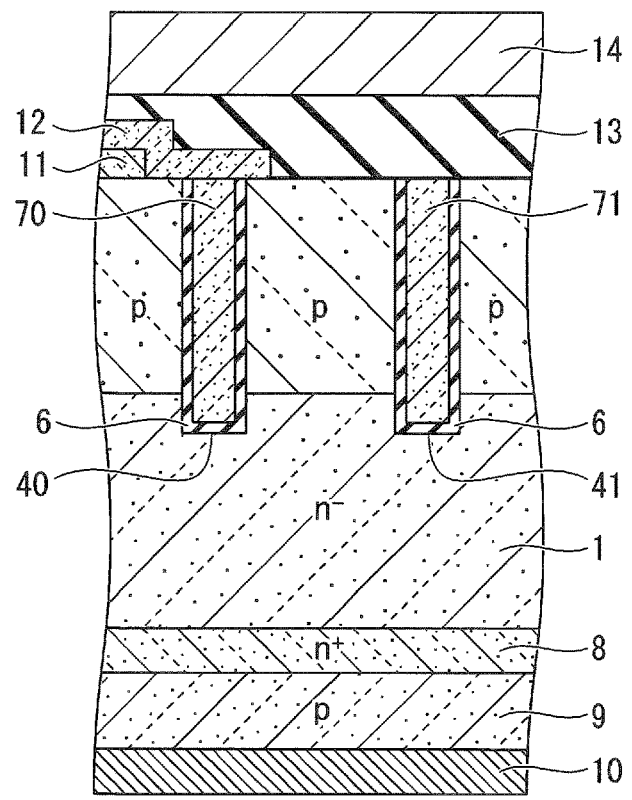
FIG. 4 is a cross-sectional view as viewed from direction B-B' in FIG. 2

FIG. 4 is a cross-sectional view as viewed from direction B-B' in FIG. 2. As illustrated in FIG. 4, a wiring layer for testing (lower-layer gate surface wiring layer) 11 is provided on the injection control region 2. The gate surface wiring layer (upper-layer gate surface wiring layer) 12 having a stepped portion extends on both the wiring layer for testing 11 and the gate electrode 70.

Figure 5:
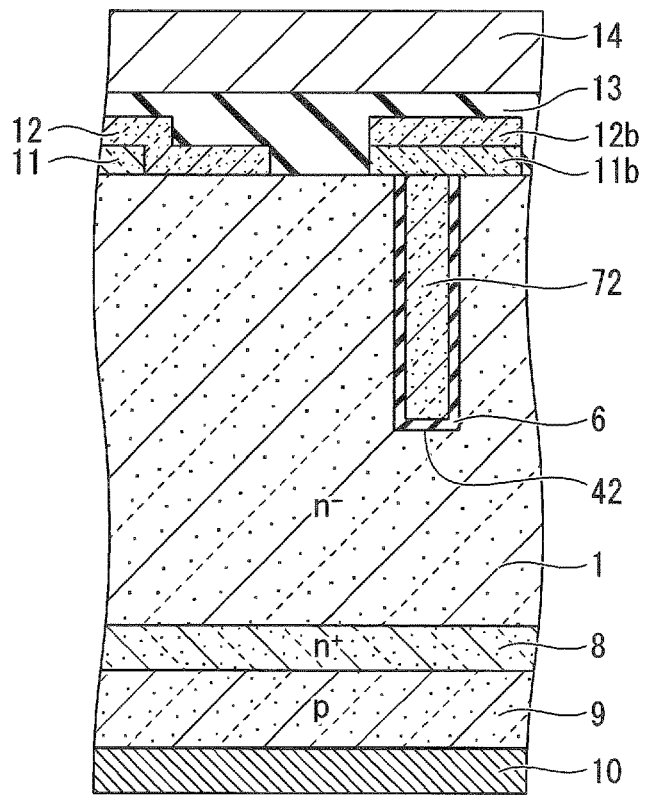
FIG. 5 is a cross-sectional view as viewed from direction C-C' in FIG. 2

FIG. 5 is a cross-sectional view as viewed from direction C-C' in FIG. 2. As illustrated in FIG. 5, the wiring layer for testing 11 is provided on the injection control region 2. The gate surface wiring layer 12 with the stepped portion extends on the wiring layer for testing 11 and the gate electrode 70. The lower-layer connection land 11b and the upper-layer connection land 12b are provided on the dummy electrode 72. The lower-layer connection land 11b and the upper-layer connection land 12b are respectively provided separately from the wiring layer for testing 11 and the gate surface wiring layer 12. The lower-layer connection land 11b serves as a projection for testing connected to the wiring layer for testing 11 during testing for the insulating properties of the gate insulating film 6 in the dummy electrode 72 in the manufacturing process (described in detail below).

A field stop layer 8 of $n^+$-type is deposited under the charge transport region 1 illustrated in FIG. 3. A buffer layer may be used instead of the filed stop layer 8, or a non-punch-through structure without including the field stop layer 8 may be employed. A main charge reception region (collector region) 9 of $p^+$-type is deposited under the field stop layer 8, and a main charge reception electrode (collector electrode) 10 is further deposited under the main charge reception region 9. The main charge reception electrode 10 used may be a single film of gold (Au), or a metal film in which aluminum (Al), nickel (Ni), and Au are stacked in this order.

During the operation of the insulated-gate semiconductor device according to the embodiment, a positive voltage is applied to the main charge reception electrode 10, and at the same time, a positive voltage of a threshold or greater is also applied to the gate electrode 70 while the main charge supply electrode 14 is grounded. The surface potential of the injection control region 2 facing the gate trench 40 is thus statically controlled via the gate insulating film 6 to form channels, so that the IGBT turns on. In the on-state, electrons as majority carriers are injected in the charge transport region 1 from the main charge supply regions 3a to 3d, and holes as minority carriers are injected in the charge transport region 1 from the main charge reception region 9. The electrons and the holes injected in the charge transport region 1 cause conductivity modulation to reduce the resistance in the charge transport region 1. The deposition of the dummy electrode 72 adjacent to the gate electrode 70 leads part of the capacitance between the gate and the collector (feedback capacitance) to be replaced with the capacitance between the collector and the emitter, so as to reduce the feedback capacitance to improve a switching speed.

When the voltage applied to the gate electrode 70 falls below the threshold, the channels of the electrons formed in the injection control region 2 are lost to lead the IGBT to turn off. In the off-state, the electrons accumulated in the charge transport region 1 are discharged from the main charge reception region 9, and the holes accumulated in the charge transport region 1 are discharged from the contact regions.

<Method of Manufacturing Insulated-Gate Semiconductor Device>

An example of a method of manufacturing the insulated-gate semiconductor device according to the embodiment, including a method of screening the insulated-gate semiconductor device, is described below with reference to FIG. 6 to FIG. 12. The explanations below mainly focus on the cross section in which the dummy trench 42 and the gate trench 40 appear as illustrated in FIG. 3.

Figure 6:
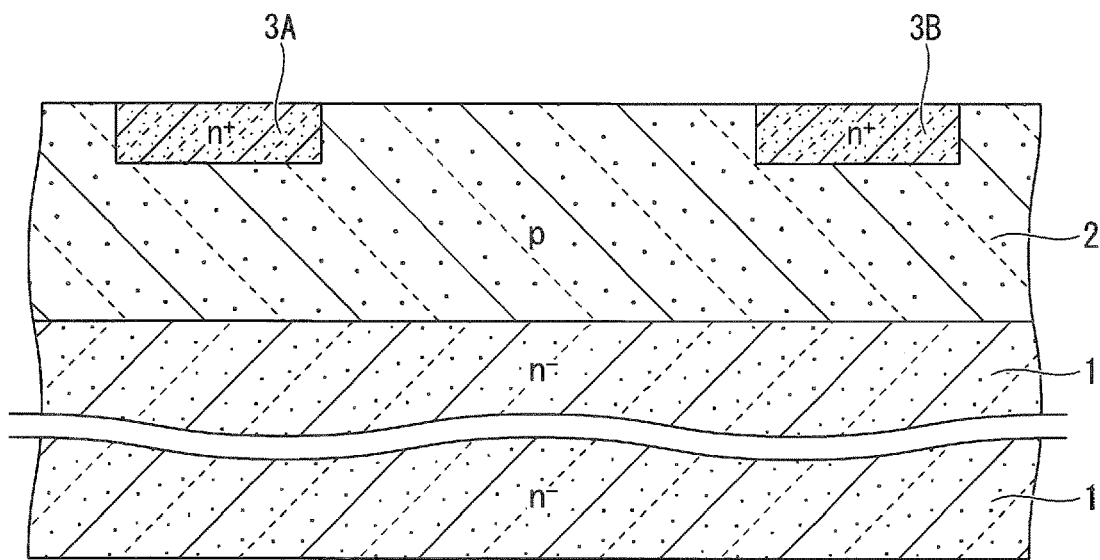
FIG. 6 is a cross-sectional view illustrating a process of manufacturing the insulated-gate semiconductor device according to the embodiment.

First, a semiconductor substrate 1 made of Si of n⁻-type is prepared as a base-body (refer to FIG. 3). Next, p-type impurity ions are implanted entirely into the top surface of the semiconductor substrate 1. The p-type impurity ions are activated to turn to p-type impurities by annealing, and are thermally diffused to a depth necessary for the injection control region 2 to be formed. The injection control region 2 may be epitaxially grown on the top surface of the semiconductor substrate 1. Subsequently, a photoresist film is coated on the top surface of the injection control region 2, and is delineated by photolithography. Using the delineated photoresist film as an ion implantation mask, n-type impurity ions are selectively implanted into the top surface of the injection control region 2. The implanted n-type impurity ions are then activated and selectively thermally diffused by annealing, so as to form electrode region-presumed layers 3A and 3B of n⁺-type in the upper portion of the injection control region 2, as illustrated in FIG. 6.

Figure 7:
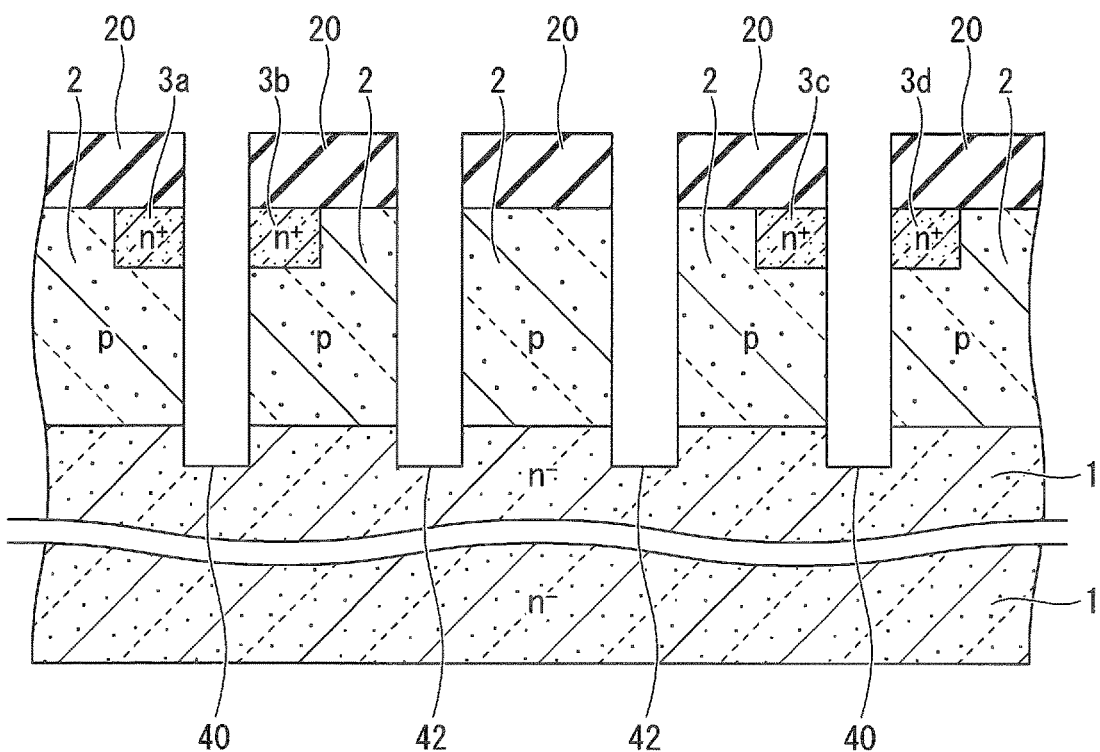
FIG. 7 is a cross-sectional view, continued from FIG. 6, illustrating the process of manufacturing the insulated-gate semiconductor device according to the embodiment.

Next, an etching passivation film 20 such as an oxide film is laminated on the top surfaces of the injection control region 2 and the electrode region-presumed layers 3A and 3B by a deposition method such as chemical vapor deposition (CVD). The etching passivation film 20 is delineated by dry etching such as photolithography and reactive ion etching (RIE). Using the delineated etching passivation film 20 as a mask for etching, the dummy trench 42 and the gate trench 40 are selectively dug by dry etching such as RIE, as illustrated in FIG. 7. The electrode region-presumed layers 3A and 3B illustrated in FIG. 6 are divided into the main charge supply regions 3a to 3d as illustrated in FIG. 7. The dummy trench 42 and the gate trench 40 penetrate the main charge supply regions 3a to 3d and the injection control region 2 to reach the upper portion of the semiconductor substrate 1. The respective dummy trenches 41 to 45 illustrated in FIG. 2 and FIG. 3 are continuously formed in one direction. The gate trench 40 is provided adjacent to the respective dummy trenches 41 to 45 to surround the respective dummy trenches 41 to 45 into the U-like shape in the planar pattern. The etching passivation film 20 is then removed.

Figure 8:
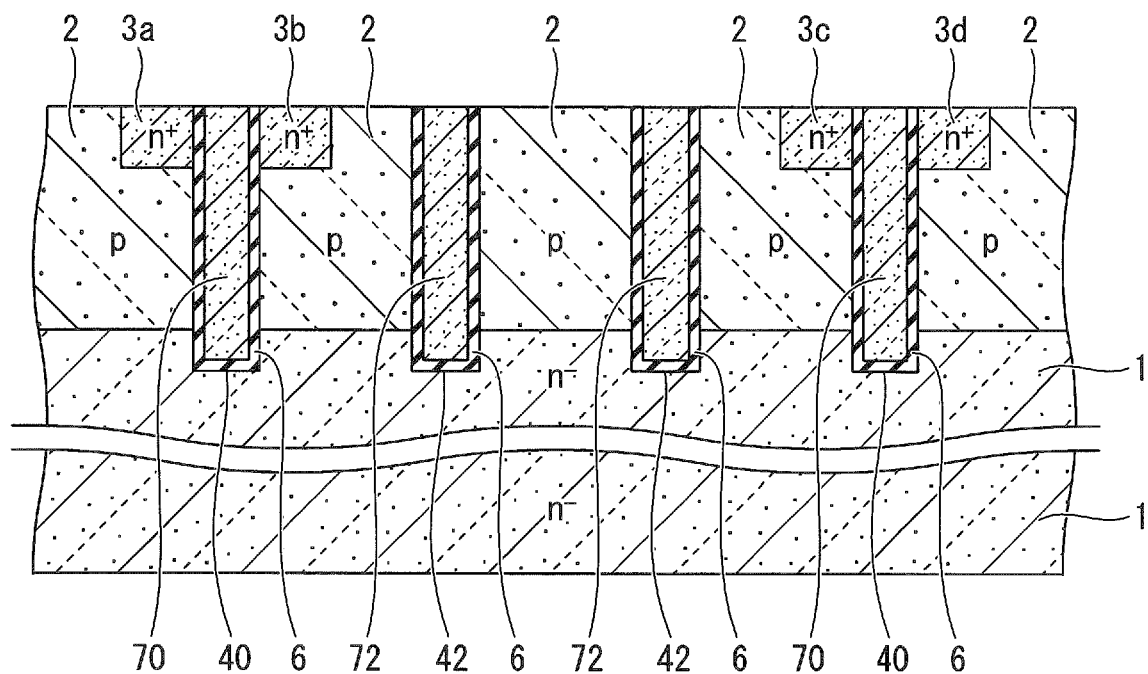
FIG. 8 is a cross-sectional view, continued from FIG. 7, illustrating the process of manufacturing the insulated-gate semiconductor device according to the embodiment.

Next, the gate insulating films 6 such as SiO₂ films are laminated on the bottom and side surfaces of the dummy trench 42 and the gate trench 40 and on the top surfaces of the injection control region 2 and the main charge supply regions 3a to 3d by thermal oxidation or CVD. A first conductive film (conductive film for filling) such as a DOPOS film (first DOPOS film) is deposited to fill each of the dummy trench 42 and the gate trench 40 by a deposition method such as CVD. The first conductive film and the gate insulating films 6 are then removed from the top surfaces of the injection control region 2 and the main charge supply regions 3a to 3d by etch back or chemical mechanical polishing (CMP), so as to expose the top surfaces of the injection control region 2 and the main charge supply regions 3a to 3d. The dummy electrode 72 and the gate electrode 70 formed of the first conductive film are thus buried in the dummy trench 42 and the gate trench 40 via the gate insulating films 6 as illustrated in FIG. 8.

Figure 9A:
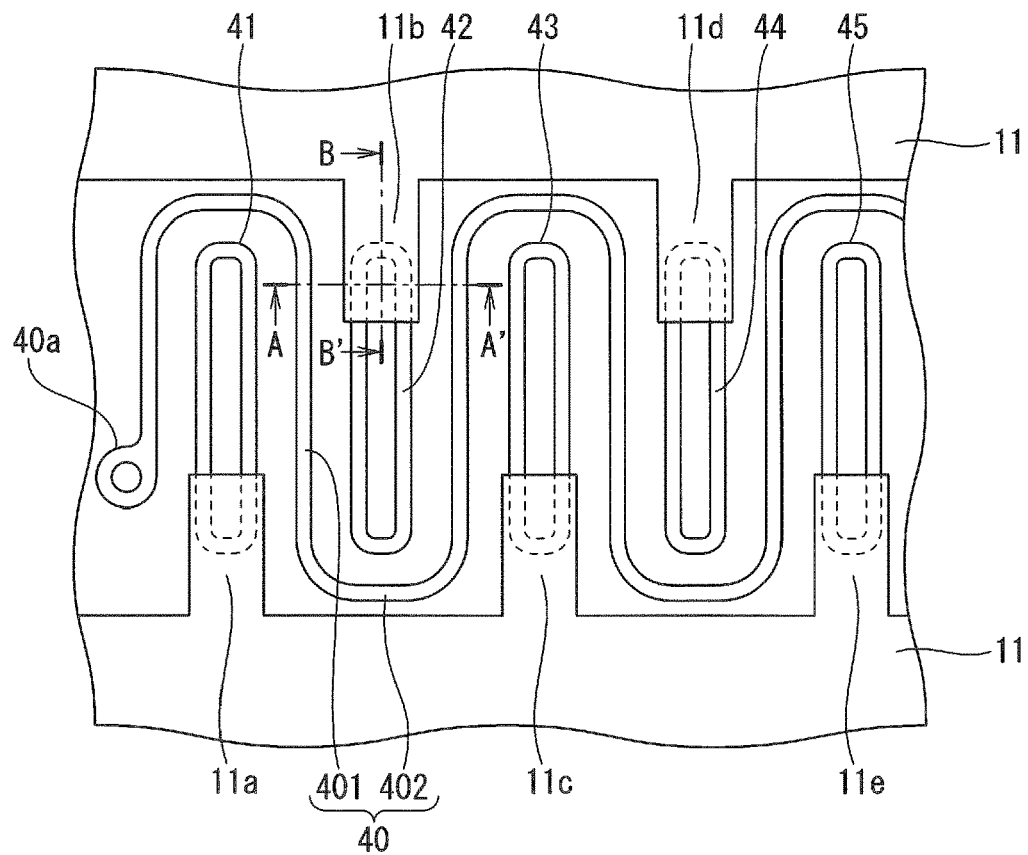
FIG. 9A is a cross-sectional view, continued from FIG. 8, illustrating the process of manufacturing the insulated-gate semiconductor device according to the embodiment.

Next, a second conductive film such as another DOPOS film (second DOPOS film) is deposited by a deposition method such as CVD. The second conductive film is delineated by photolithography and dry etching such as RIE, so as to form the wiring layer for testing 11 and projections for testing 11a to 11e connected to the wiring layer for testing 11, as illustrated in FIG. 9A. The projections for testing 11a to 11e are respectively located to cover the end portions of the dummy trenches 41 to 45 on the opening side of the respective U-like shapes of the gate trench 40. A dummy pad (not illustrated) connected to the wiring layer for testing 11 is also formed.

Figure 9B:
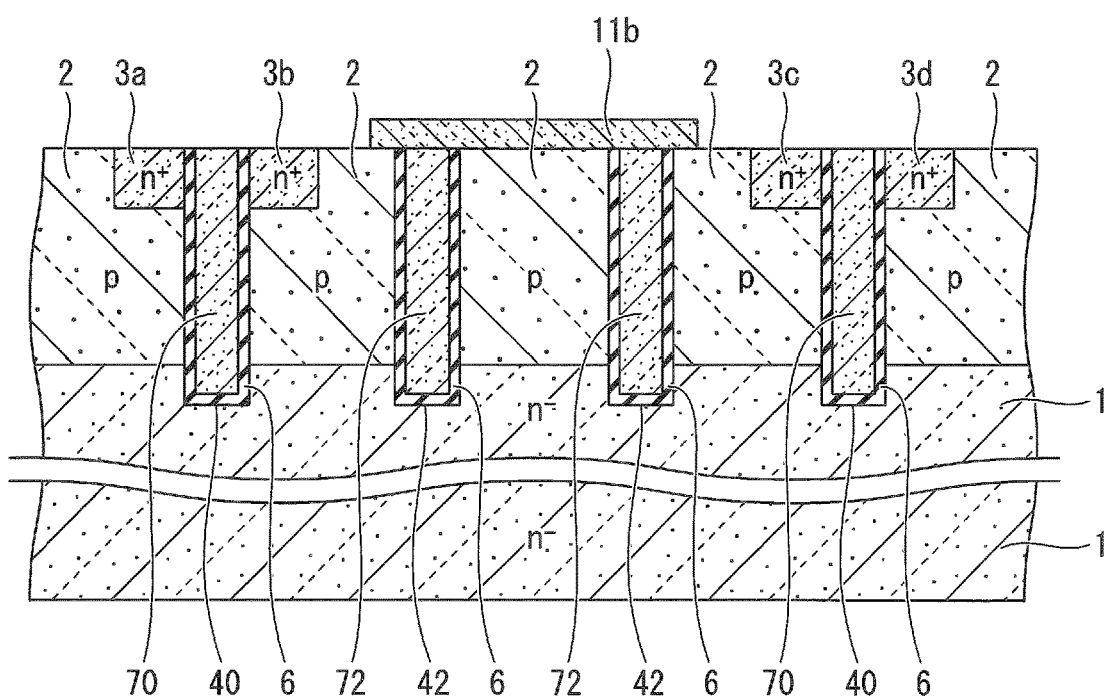
FIG. 9B is a cross-sectional view as viewed from direction A-A' in FIG. 9A
Figure 9C:
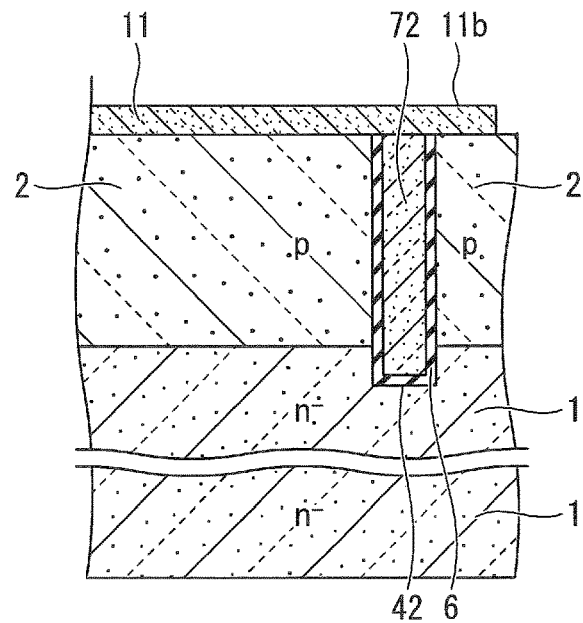
FIG. 9C is a cross-sectional view as viewed from direction B-B' in FIG. 9A

FIG. 9B is a cross-sectional process view as viewed from direction A-A' in FIG. 9A. As illustrated in FIG. 9B, the projection for testing 11b is provided on and in contact with the dummy electrode 72. FIG. 9C is a cross-sectional process view as viewed from direction B-B' in FIG. 9A. As illustrated in FIG. 9C, the projection for testing 11b connected to the wiring layer for testing 11 extends to cover the dummy electrode 72.

Figure 10:
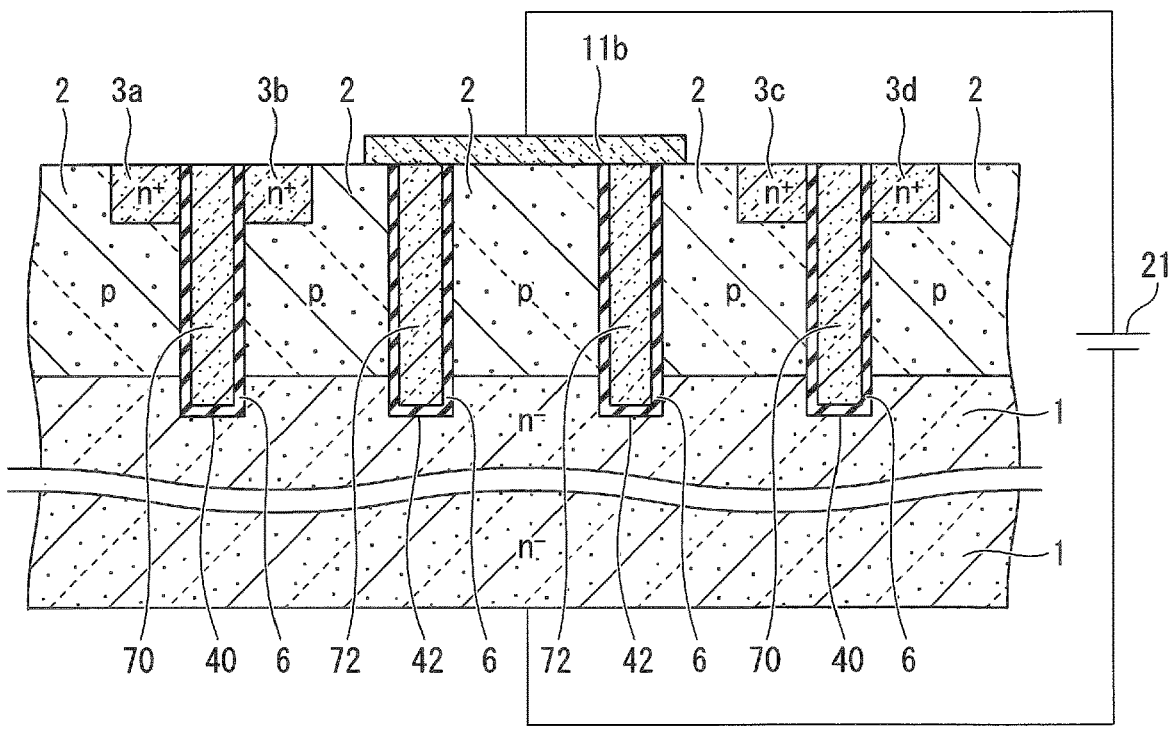
FIG. 10 is a cross-sectional view, continued from FIG. 9A to FIG. 9C, illustrating the process of manufacturing the insulated-gate semiconductor device according to the embodiment.

Next, only the gate insulating film 6 in the dummy trench 42 is subjected to insulating property testing so as to be screened, independently of the gate insulating film 6 in the gate trench 40, by use of the wiring layer for testing 11. In particular, as illustrated in FIG. 10, the bottom surface of the semiconductor substrate 1 is placed on a conductive stage (not illustrated). A negative electrode of a power supply 21 is electrically connected to the stage, and a tip of a probe needle (not illustrated) electrically connected to a positive electrode of the power supply 21 is pressed against the dummy pad connected to the wiring layer for testing 11. A higher voltage than a voltage in normal operation is applied between the dummy pad and the bottom surface of the semiconductor substrate 1 from the power supply 21 so as to carry out dummy gate shock testing. The dummy gate shock testing is an acceleration test for evaluating the time-dependent dielectric breakdown behavior. The dummy gate shock testing is performed such that a higher voltage (about 4 MV/cm, for example) than a voltage normally applied between a dummy gate and a collector (about 2 MV/cm, for example) is applied between the dummy pad and the bottom surface of the semiconductor substrate 1. A current flowing between the dummy pad and the bottom surface of the semiconductor substrate 1 is then measured. When a leakage current between the dummy pad and the bottom surface of the semiconductor substrate 1 is a reference value or greater, the gate insulating film 6 is determined to be degraded, so as to reliably confirm the insulating properties of the gate insulating film 6 by the testing.

Next, a third conductive film such as still another DOPOS film (third DOPOS film) is deposited on the wiring layer for testing 11 and the projections for testing 11a to 11e by a deposition method such as CVD. The third conductive film may be formed after the wiring layer for testing 11 and the projections for testing 11a to 11 e are removed. The third conductive film is delineated by photolithography and dry etching such as RIE. The projections for testing 11a to 11e under the third conductive film are partly and selectively removed, so as to separate the projections for testing 11a to 11e from the wiring layer for testing 11. The projections for testing 11a to 11e separated from the wiring layer for testing 11 are used as the lower-layer connection lands 11a to 11 e. The dummy pad connected to the wiring layer for testing 11 is then removed.

Figure 11A:
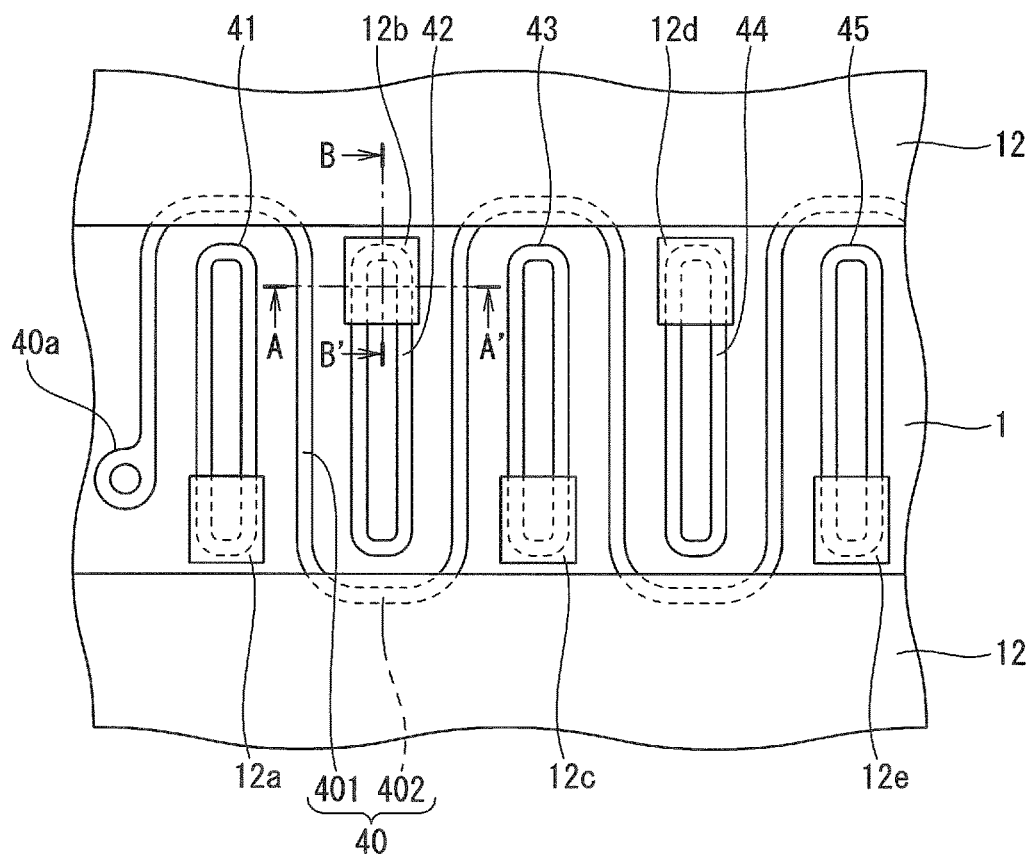
FIG. 11A is a cross-sectional view, continued from FIG. 10, illustrating the process of manufacturing the insulated-gate semiconductor device according to the embodiment.

The patterns of the gate surface wiring layer 12 and the upper-layer connection lands 12a to 12e formed of the third conductive film as illustrated in FIG. 11A are thus formed. The gate surface wiring layer 12 are provided to cover the wiring layer for testing 11. The gate surface wiring layer 12 overlaps with the connecting parts 402 connecting the stripes 401 of the gate trench 40 so as to be electrically connected to the gate trench 40. The upper-layer connection lands 12a to 12e respectively overlap with the lower-layer connection lands 11a to 11e so as to be electrically connected to the dummy trenches 41 to 45.

Figure 11B:
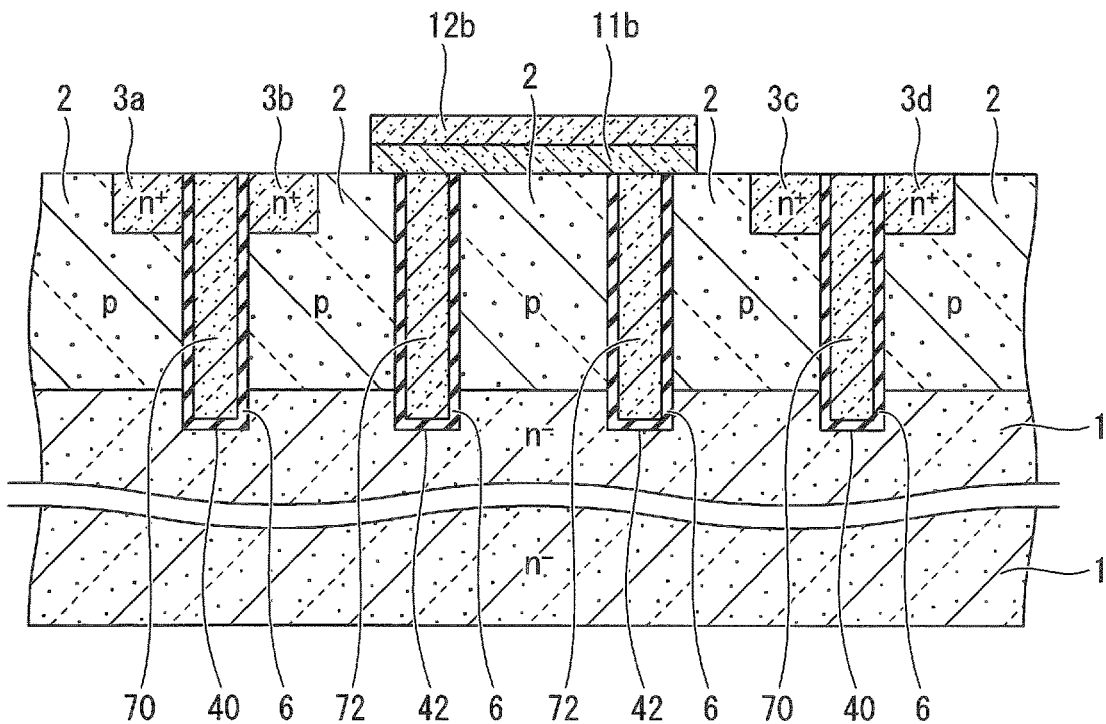
FIG. 11B is a cross-sectional view as viewed from direction A-A' in FIG. 11A.
Figure 11C:
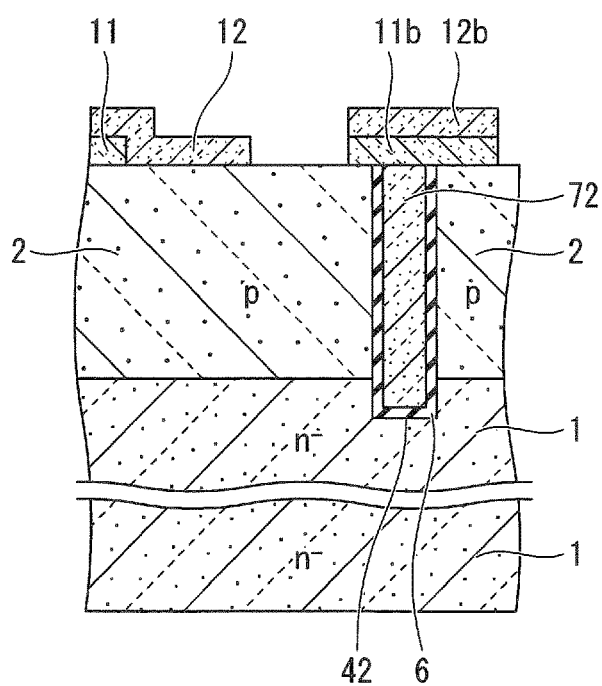
FIG. 11C is a cross-sectional view as viewed from direction B-B' in FIG. 11A.

FIG. 11B is a cross-sectional process view as viewed from direction A-A' in FIG. 11A. As illustrated in FIG. 11B, the lower-layer connection land 11b and the upper-layer connection land 12b are provided on and in contact with the dummy electrode 72. FIG. 11C is a cross-sectional process view as viewed from direction B-B' in FIG. 11A. As illustrated in FIG. 11C, the wiring layer for testing 11 and the lower-layer connection land 11b are separated from each other. The gate surface wiring layer 12 extends longer than the wiring layer for testing 11 toward the dummy electrode 72.

Next, the interlayer insulating film 13 is deposited on the top surfaces of the dummy electrode 72, the gate electrode 70, the injection control region 2, and the main charge supply regions 3a to 3d by a deposition method such as CVD. The interlayer insulating film 13 is then partly and selectively removed by photolithography and dry etching, so as to open the contact holes in the interlayer insulating film 13 to expose the top surfaces of the main charge supply regions 3a to 3d and the upper-layer connection land 12b.

Next, a metallic layer such as an Al film is entirely deposited over the interlayer insulating film 13, the main charge supply regions 3a to 3d, and the upper-layer connection land 12b by sputtering or evaporation. The metallic layer such as an Al film is delineated by photolithography and dry etching such as RIE, so as to form the main charge supply electrode 14.

Figure 12:
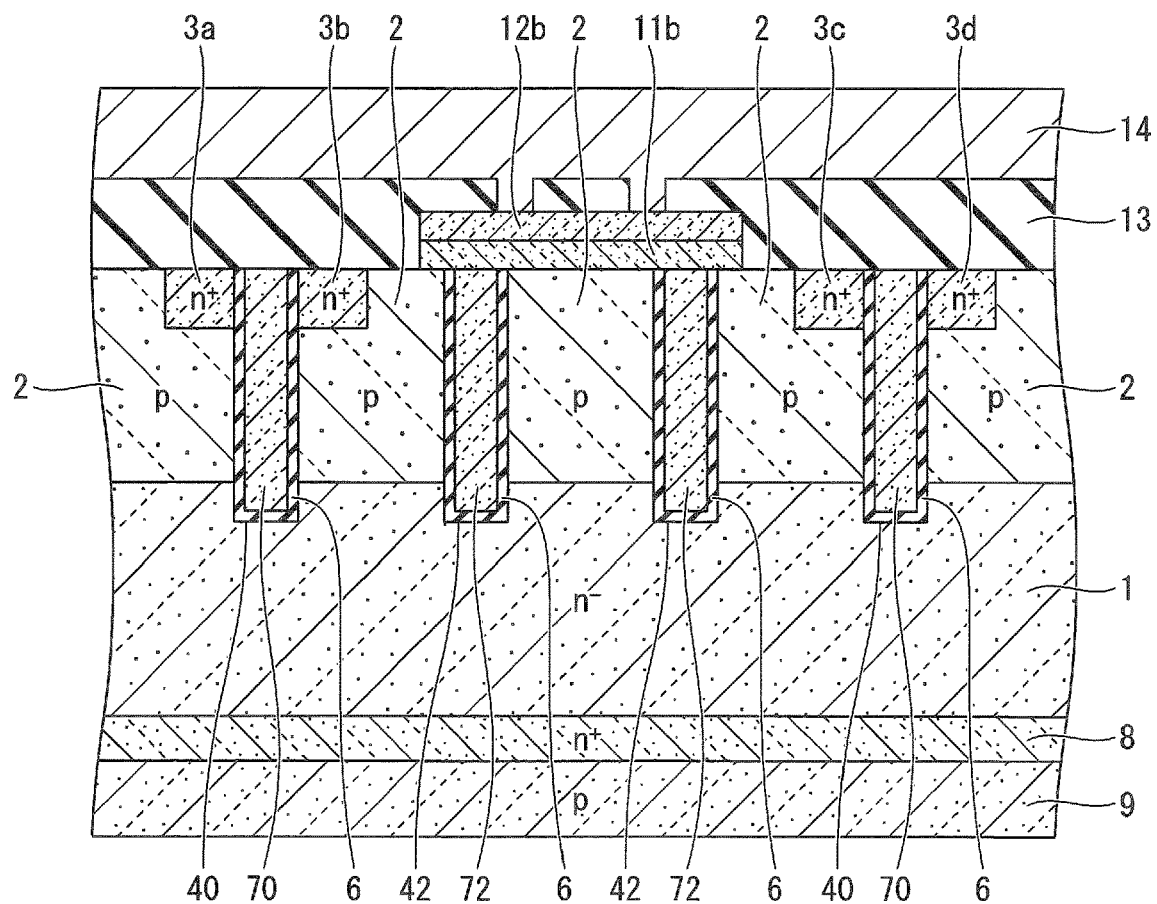
FIG. 12 is a cross-sectional view, continued from FIG. 11A to FIG. 11C, illustrating the process of manufacturing the insulated-gate semiconductor device according to the embodiment.

Next, the thickness of the semiconductor substrate 1 is adjusted by CMP, for example. After the thickness adjustment, p-type impurity ions are implanted into the bottom surface of the semiconductor substrate 1. Further, n-type impurity ions are implanted into the bottom surface of the semiconductor substrate 1 to a depth having a deeper projected range than the depth of the ion implantation of the p-type impurity ions. The implanted impurity ions are then activated and thermally diffused by annealing, so as to form the field stop layer 8 of $n^+$-type and the main charge reception region 9 of $p^+$-type as illustrated in FIG. 12. The field stop layer 8 and the main charge reception region 9 may be sequentially epitaxially grown on the bottom surface of the semiconductor substrate 1.

Next, the main charge reception electrode 10 such as a film including Au is formed on the bottom surface of the main charge reception region 9 by sputtering or evaporation, as illustrated in FIG. 3. The semiconductor substrate 1 is then diced into a plurality of semiconductor chips, so as to complete the insulated-gate semiconductor device according to the embodiment.

The obtained semiconductor chips are then each subjected to the gate shock testing to test the insulating properties of the gate insulating film 6 in the gate trench 40 so as to screen out the defective gate insulating film 6 in the gate trench 40. This screening is the first gate shock testing for the gate insulating film 6 in the gate trench 40.

The method of manufacturing the insulated-gate semiconductor device according to the embodiment evaluates the insulating properties of the gate insulating films 6 in the dummy trenches 41 to 45, so as to reliably ensure the quality of the gate insulating films 6 in the dummy trenches 41 to 45.

Subjecting only the gate insulating films 6 in the dummy trenches 41 to 45 to the insulating property testing, independently of the gate insulating film 6 in the gate trench 40, can eliminate the influence of the testing on the gate insulating film 6 in the gate trench 40. Since the required insulating properties are lower for the gate insulating films 6 in the dummy trenches 41 to 45 than for the gate insulating film 6 in the gate trench 40, the electric field of the screening conditions can be lessened depending on the resistance necessary for the gate insulating films 6 in the dummy trenches 41 to 45. The incidence of defects thus can be reduced, so as to decrease the amount of particles derived from defects to be caused, avoiding environmental contamination during the manufacturing process accordingly. The gate insulating film 6 in the gate trench 40 is subjected to the gate shock testing to test the insulating properties of the gate insulating film 6 in the gate trench 40 after the completion of the manufacturing process, so as to screen out damage caused in the rest of the process.

The projections for testing 11a to 11 e connects the dummy trenches 41 to 45 to the wiring layer for testing 11 via the openings of the U-like shapes of the gate trench 40 in the screening test of the gate insulating films 6 of the dummy trenches 41 to 45, so as to connect the dummy trenches 41 to 45 to the dummy pad via the wiring layer for testing 11 with no contact holes formed. This decreases the number of steps including photolithography steps, so as to avoid an increase in cost derived from an increase in the number of steps.

Comparative Example

Figure 13:
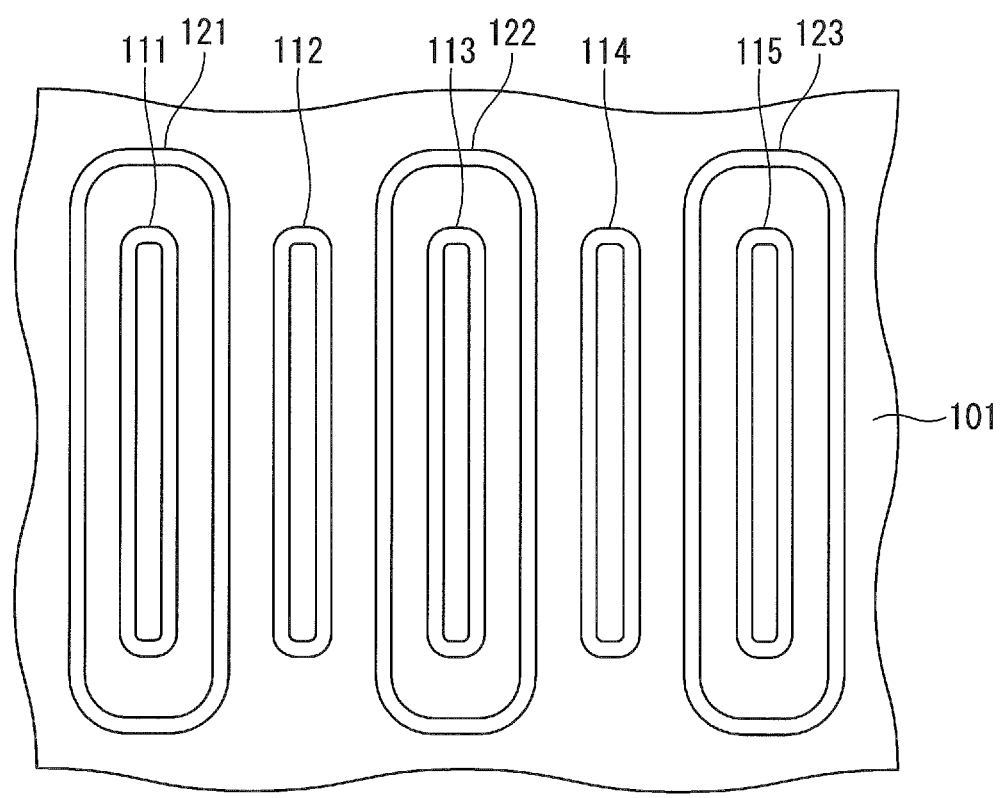
FIG. 13 is a plan view illustrating an insulated-gate semiconductor device according to a comparative example.

An insulated-gate semiconductor device of a comparative example is described below. As illustrated in FIG. 13, the insulated-gate semiconductor device of the comparative example includes dummy trenches 111, 112, 113, 114, and 115, and gate trenches 121, 122, and 123 provided in an upper portion of a semiconductor substrate 101. The gate trenches 121 to 123 each have a closed O-like shape completely surrounding the dummy trenches 111, 113, and 115 in a planar pattern.

When the gate insulating films in the dummy trenches 111, 113, and 115 are only subjected to the testing by the screening method using the insulated-gate semiconductor device of the comparative example, the number of steps including photolithography steps inevitably increases so as to form contact holes necessary for wiring in order to extract the dummy trenches 111, 113, and 115 to the outside of the gate trenches 121 to 123. The increase in the number of the steps greatly influences on the increase in cost. While a DOPOS film could be formed entirely on the semiconductor substrate 101 to execute the screening test of the gate insulating films in all of the dummy trenches 111 to 115 and the gate trenches 121 to 123 in order to avoid an increase in the number of steps and cost, the screening testing of the gate insulating films in the dummy trenches 111 to 115 cannot be carried out independently of the gate insulating films in the gate trenches 121 to 123.

In contrast, according to the method of screening the insulated-gate semiconductor device according to the embodiment of the present invention, the dummy trenches 41 to 45 can be extracted via the openings of the U-like shapes of the gate trench 40, since the gate trench 40 surrounds the respective dummy trenches 41 to 45 into the U-like shape in the planar pattern so as not to completely surround the dummy trenches 41 to 45. The method according to the embodiment thus can eliminate the formation of contact holes for extracting the dummy trenches 41 to 45 to the outside, so as to independently perform the screening test only on the gate insulating films in the dummy trenches 41 to 45 while simply adding only one photolithography step.

First Modified Example

Figure 14:
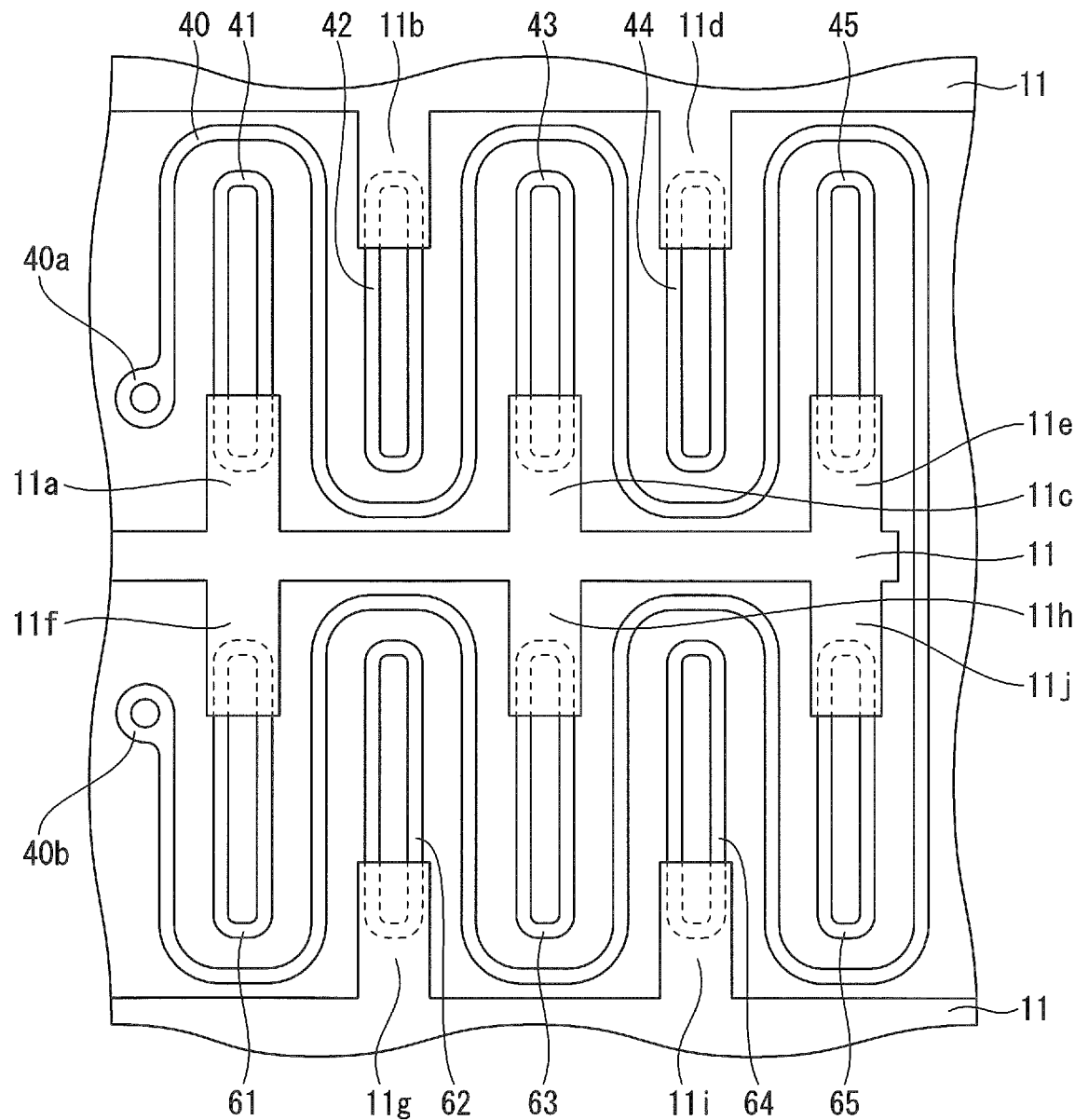
FIG. 14 is a cross-sectional view illustrating a process of manufacturing the insulated-gate semiconductor device according to a first modified example of the embodiment.

A method of manufacturing an insulated-gate semiconductor device according to a first modified example of the embodiment is described below with reference to a planar pattern illustrated in FIG. 14, which is an enlarged view of area B illustrated in FIG. 1 defined by the double dashed-dotted line. As illustrated in FIG. 14, the insulated-gate semiconductor device according to the first modified example of the embodiment includes the gate trench 40 having a continuous arrangement in a planar pattern, in which a set of dummy trenches 41, 42, 43, 44, and 45 and a set of dummy trenches 61, 62, 63, 64, and 65 are arranged in two rows such that the stripe-shaped gate surface wiring layer 12 is interposed between the two rows. The gate trench 40 in each row has a meandering line structure extending between the respective dummy trenches 41 to 45 and the respective dummy trenches 61 to 65. The ends of the gate trench 40 in the respective rows are connected to each other in the extending direction of the stripes 401 of the gate trench 40. The other ends 40a and 40b of the gate trench 40 are each formed into a circle.

Figure 15:
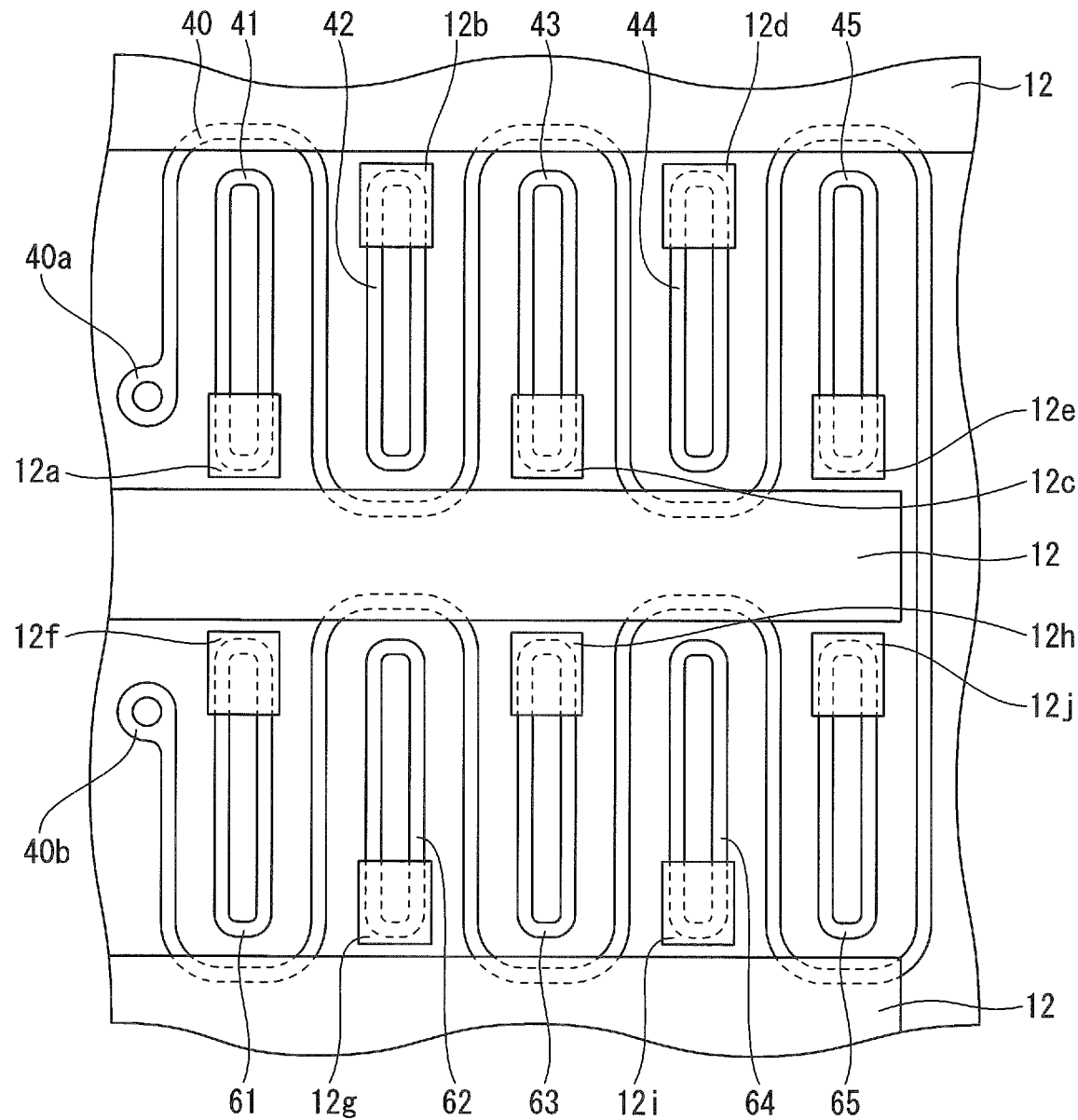
FIG. 15 is a cross-sectional view, continued from FIG. 14, illustrating the process of manufacturing the insulated-gate semiconductor device according to the first modified example of the embodiment.

The method of manufacturing the insulated-gate semiconductor device according to the first modified example of the embodiment forms the wiring layer for testing 11, and projections for testing 11a, 11b, 11c, 11d, 11e, 11f, 11g, 11h, 11i, and 11j for connecting the end portions of the dummy trenches 41 to 45 and the dummy trenches 61 to 65 to the wiring layer for testing 11, as illustrated in FIG. 14. The projections for testing 11a to 11j connect the dummy trenches 41 to 45 and the dummy trenches 61 to 65 to the wiring layer for testing 11 via the openings of the U-like shapes of the gate trench 40. A voltage is applied between the wiring layer for testing 11 and the bottom surface of the semiconductor substrate, so as to selectively test the insulating properties of the gate insulating films 6 in the dummy trenches 41 to 45 and the dummy trenches 61 to 65. The gate surface wiring layer 12 is then formed on the connecting parts connecting the stripes of the gate trench 40 together, and the projections for testing 11a to 11j are separated from the wiring layer for testing 11 so as to form the lower-layer connection lands 11a to 11j, as illustrated in FIG. 15. The upper-layer connection lands 12a to 12j are further formed on the end portions of the dummy trenches 41 to 45 and the dummy trenches 61 to 65 and on the lower-layer connection lands 11a to 11j. The following steps are the same as those illustrated in FIG. 12, and overlapping explanations are not repeated below.

Second Modified Example

Figure 16:
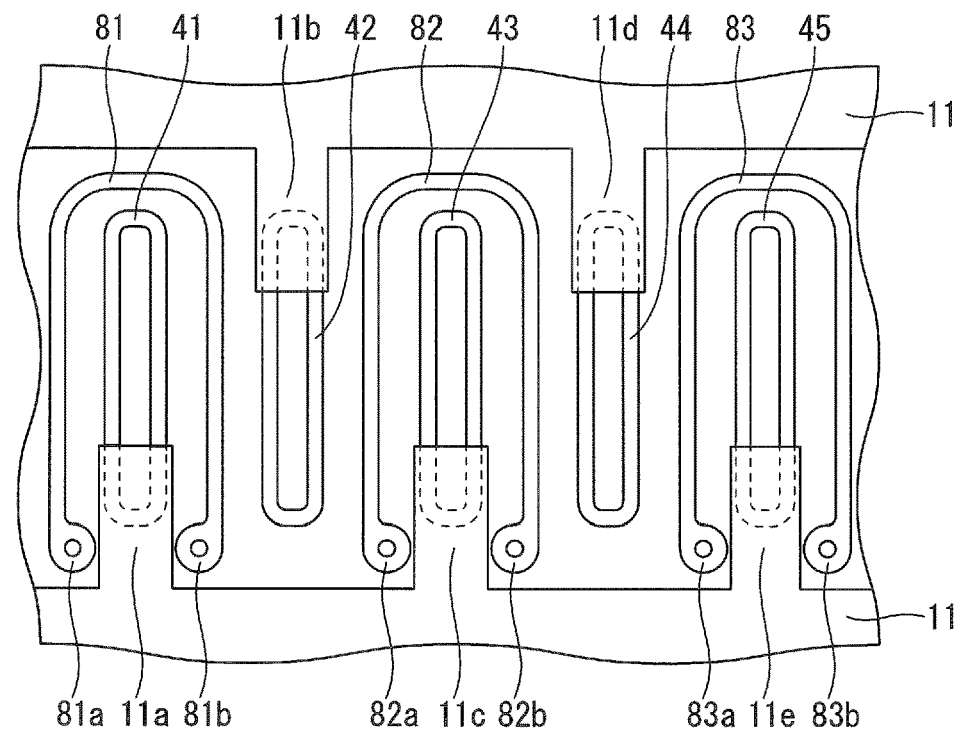
FIG. 16 is a cross-sectional view illustrating a process of manufacturing the insulated-gate semiconductor device according to a second modified example of the embodiment.

A method of manufacturing an insulated-gate semiconductor device according to a second modified example of the embodiment differs from the method of manufacturing the insulated-gate semiconductor device according to the embodiment in a planar pattern of gate trenches 81, 82, and 83, as illustrated in FIG. 16. The gate trenches 81, 82, and 83 have a U-like shape in a planar pattern respectively surrounding the dummy trenches 41, 43, and 45, and are separated from each other. Both ends 81a and 81b of the gate trench 81, both ends 82a and 82b of the gate trench 82, and both ends 83a and 83b of the gate trench 83 are formed into a circle.

Figure 17:
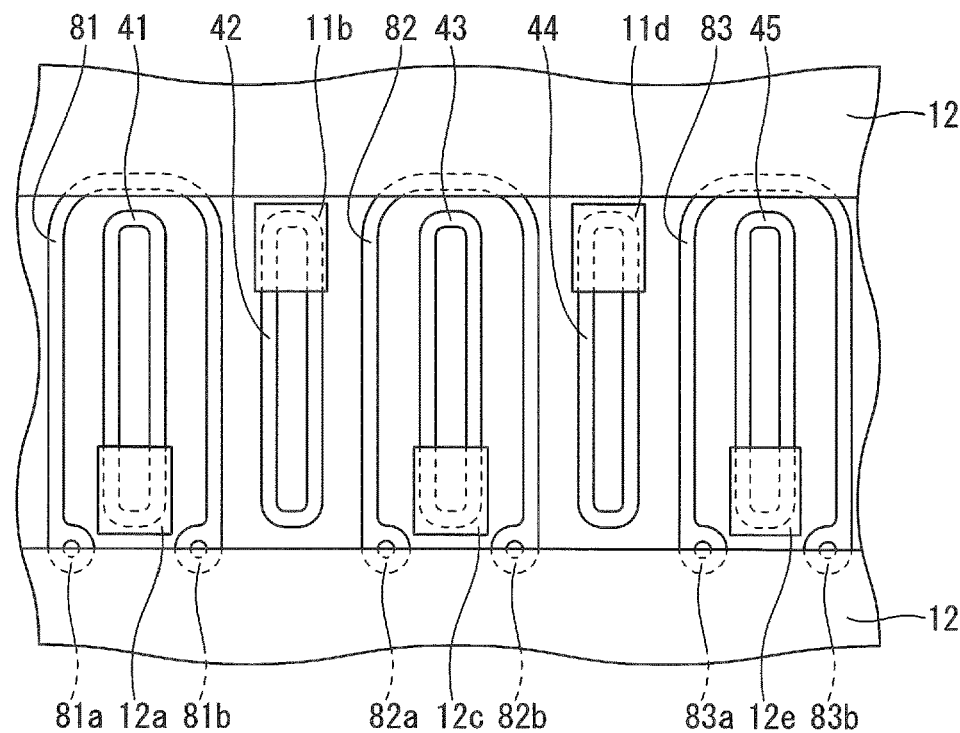
FIG. 17 is a cross-sectional view, continued from FIG. 14, illustrating the process of manufacturing the insulated-gate semiconductor device according to the second modified example of the embodiment.

The method of manufacturing the insulated-gate semiconductor device according to the second modified example of the embodiment forms the wiring layer for testing 11, and the projections for testing 11a to 11e for connecting the end portions of the dummy trenches 41 to 45 to the wiring layer for testing 11, as illustrated in FIG. 16. The projections for testing 11a, 11c, and 11e connect the dummy trenches 41, 43, and 45 to the wiring layer for testing 11 via the openings of the U-like shapes of the gate trenches 81, 82, and 83. A voltage is applied between the wiring layer for testing 11 and the bottom surface of the semiconductor substrate, so as to selectively test the insulating properties of the gate insulating films 6 in the dummy trenches 41 to 45. The gate surface wiring layer 12 is then formed on the connecting parts connecting the stripes of the gate trenches 81, 82, and 83 together, and the projections for testing 11a to 11 e are separated from the wiring layer for testing 11 so as to form the lower-layer connection lands 11a to 11e, as illustrated in FIG. 17. The upper-layer connection lands 12a to 12e are further formed on the end portions of the dummy trenches 41 to 45 and on the lower-layer connection lands 11a to 11 e. The following steps are the same as those illustrated in FIG. 12, and overlapping explanations are not repeated below.

Third Modified Example

Figure 18:
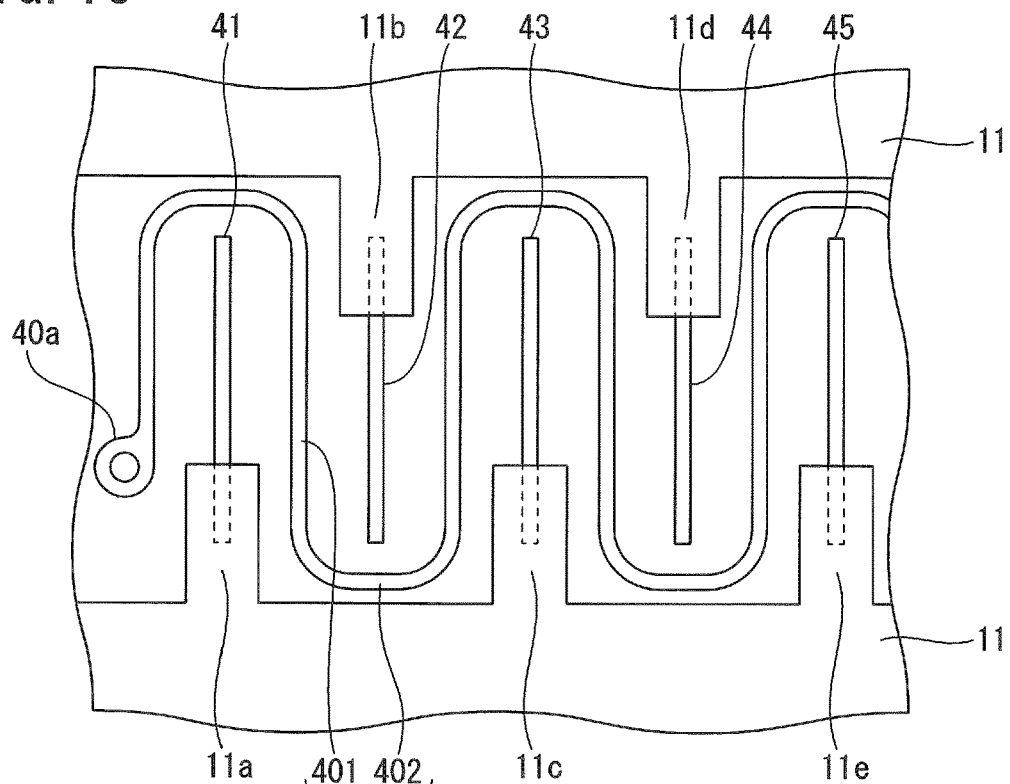
FIG. 18 is a cross-sectional view illustrating a process of manufacturing the insulated-gate semiconductor device according to a third modified example of the embodiment.

A method of manufacturing an insulated-gate semiconductor device according to a third modified example of the embodiment differs from the method of manufacturing the insulated-gate semiconductor device according to the embodiment in that the dummy trenches 41 to 45 have an I-like shape in a planar pattern, as illustrated in FIG. 18. The dummy trenches 41 to 45 are arranged parallel to each other.

Figure 19:
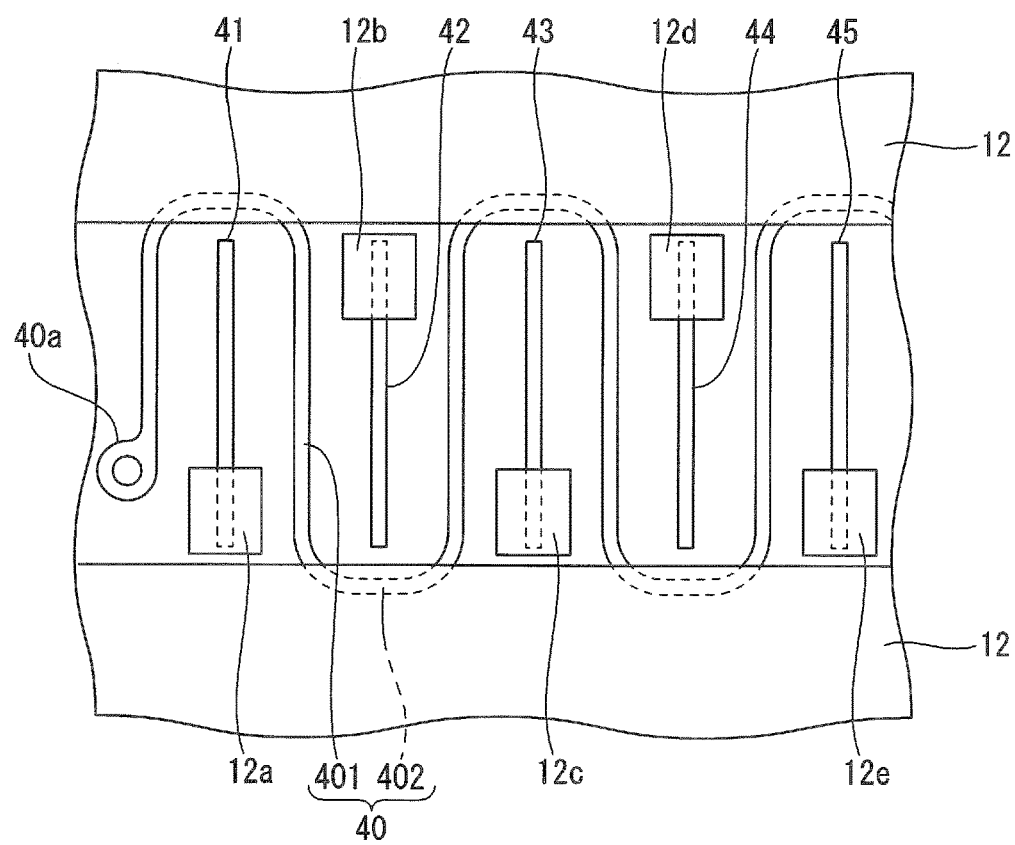
FIG. 19 is a cross-sectional view, continued from FIG. 14, illustrating the process of manufacturing the insulated-gate semiconductor device according to the third modified example of the embodiment.

The method of manufacturing the insulated-gate semiconductor device according to the third modified example of the embodiment forms the wiring layer for testing 11, and the projections for testing 11a to 11e for connecting the end portions of the dummy trenches 41 to 45 to the wiring layer for testing 11, as illustrated in FIG. 18. The projections for testing 11a to 11e connect the dummy trenches 41 to 45 to the wiring layer for testing 11 via the openings of the U-like shapes of the gate trench 40. A voltage is applied between the wiring layer for testing 11 and the bottom surface of the semiconductor substrate, so as to selectively test the insulating properties of the gate insulating films 6 in the dummy trenches 41 to 45. The gate surface wiring layer 12 is then formed on the connecting parts connecting the stripes of the gate trench 40 together, and the projections for testing 11a to 11e are separated from the wiring layer for testing 11 so as to form the lower-layer connection lands 11a to 11e, as illustrated in FIG. 19. The upper-layer connection lands 12a to 12e are further formed on the end portions of the dummy trenches 41 to 45 and on the lower-layer connection lands 11a to 11e. The following steps are the same as those illustrated in FIG. 12, and overlapping explanations are not repeated below.

Fourth Modified Example

Figure 20:
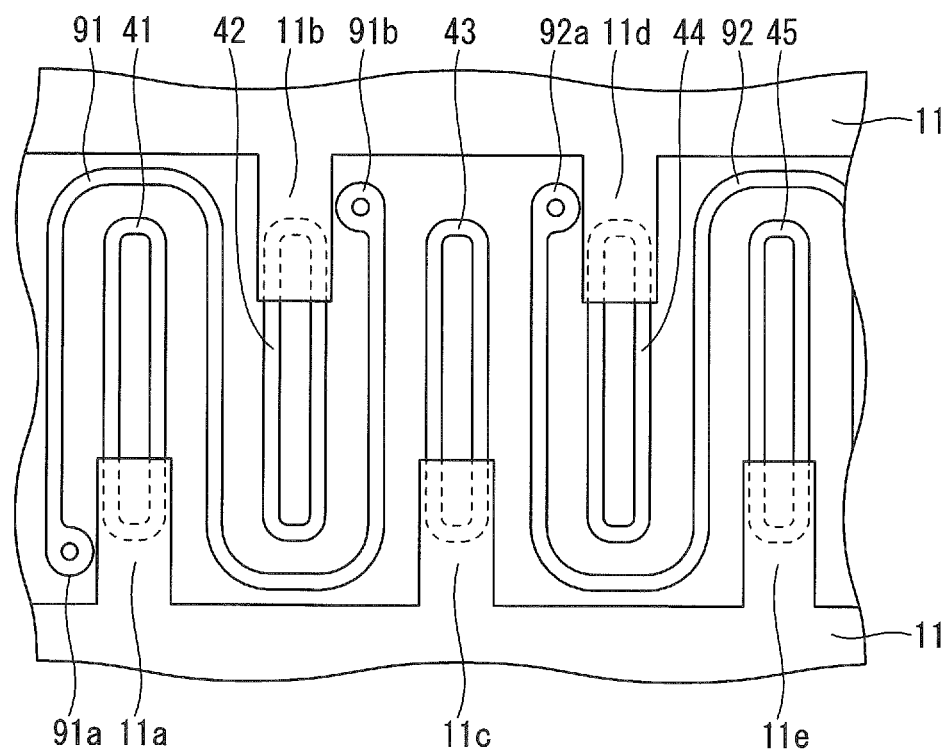
FIG. 20 is a cross-sectional view illustrating a process of manufacturing the insulated-gate semiconductor device according to a fourth modified example of the embodiment.

A method of manufacturing an insulated-gate semiconductor device according to a fourth modified example of the embodiment differs from the method of manufacturing the insulated-gate semiconductor device according to the embodiment in including gate trenches 91 and 92 having an N-like shape in a planar pattern, as illustrated in FIG. 20. The gate trench 91 having the N-like shape in the planar pattern surrounds the dummy trenches 41 and 42 into the respective U-like shapes arranged in opposite directions and connected to each other. The gate trench 92 having the N-like shape in the planar pattern surrounds the dummy trenches 44 and 45 into the respective U-like shapes arranged in opposite directions and connected to each other. Both ends 91a and 91b of the gate trench 91 and both ends 92a and 92b of the gate trench 92 are formed into a circle.

The method of manufacturing the insulated-gate semiconductor device according to the fourth modified example of the embodiment forms the wiring layer for testing 11, and the projections for testing 11a to 11e for connecting the end portions of the dummy trenches 41 to 45 to the wiring layer for testing 11, as illustrated in FIG. 20. The projections for testing 11a, 11b, 11d, and 11e connect the dummy trenches 41, 42, 44, and 45 to the wiring layer for testing 11 via the openings of the U-like shapes of the gate trenches 91 and 92. A voltage is applied between the wiring layer for testing 11 and the bottom surface of the semiconductor substrate, so as to selectively test the insulating properties of the gate insulating films 6 in the dummy trenches 41 to 45. Although not illustrated, the gate surface wiring layer is then formed on the connecting parts connecting the stripes of the gate trenches 91 and 92 together, and the projections for testing 11a to 11e are separated from the wiring layer for testing 11 so as to form the lower-layer connection lands 11a to 11 e. The upper-layer connection lands are further formed on the end portions of the dummy trenches 41 to 45 and on the lower-layer connection lands 11a to 11e. The following steps are the same as those illustrated in FIG. 12, and overlapping explanations are not repeated below.

Other Embodiments

As described above, the invention has been described according to the embodiments, but it should not be understood that the description and drawings implementing a portion of this disclosure limit the invention. Various alternative embodiments of the present invention, examples, and operational techniques will be apparent to those skilled in the art from this disclosure.

The insulated-gate semiconductor device according to the embodiment has been illustrated with the case of using the IGBT having a trench gate structure, but is not limited to the IGBT. The embodiment may be applied to various types of insulated-gate semiconductor devices such as a trench gate MISFET.

The insulated-gate semiconductor device according to the embodiment has been illustrated with the case of being made of silicon (Si). The embodiment can also be applied to an insulated-gate semiconductor device made of a semiconductor (wide-bandgap semiconductor) material having a greater band gap than Si, such as silicon carbide (SiC), gallium nitride (GaN), diamond, or aluminum nitride (AlN).

As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present Specification.

What is claimed is:

1. An insulated-gate semiconductor device comprising:
   a charge transport region of a first conductivity-type;
   an injection control region of a second conductivity-type provided on the charge transport region;
   a main charge supply region of the first conductivity-type selectively provided on the injection control region;
   a dummy electrode buried, via a gate insulating film, in a dummy trench penetrating the main charge supply region and the injection control region to reach the charge transport region;
   a gate electrode buried, via the gate insulating film, in a gate trench having at least one U-like shape in a planar pattern adjacent to the dummy trench to surround the dummy trench into the U-like shape, and having a depth identical to a depth of the dummy trench;
   a gate surface wiring layer connected to the gate electrode at a bottom portion of the U-like shape; and
   a connection land formed of a conductive layer connected to the dummy electrode, and selectively deposited on an opening side of the U-like shape.

2. The insulated-gate semiconductor device of claim 1, wherein the dummy trench and the gate trench have stripes extending parallel to each other and having a continuous arrangement in a direction perpendicular to the extending direction of the stripes.

3. The insulated-gate semiconductor device of claim 2, wherein:
   two sets of the dummy trench and the gate trench having the continuous arrangement in the direction perpendicular to the extending direction are provided in rows such that the gate surface wiring layer having a stripe-shape extending parallel to the perpendicular direction is interposed between the two rows; and
   ends of the gate trench in the respective rows are connected to each other in the extending direction.

4. The insulated-gate semiconductor device of claim 1, wherein the gate trench has a plurality of U-like shapes alternately inverted and connected to each other in the planar pattern, and is delineated between a plurality of dummy trenches so as to have a meandering line surrounding the dummy trenches into the U-like shapes.

5. The insulated-gate semiconductor device of claim 1, wherein the dummy trench has an O-like or I-like shape.

6. A method of manufacturing an insulated-gate semiconductor device, comprising:
   forming an injection control region of a second conductivity-type on a charge transport region of a first conductivity-type;
   forming a main charge supply region of the first conductivity-type on the injection control region;
   digging a dummy trench so as to penetrate the main charge supply region and the injection control region to reach the charge transport region, and digging a gate trench so as to have a U-like shape in a planar pattern adjacent to the dummy trench to surround the dummy trench into the U-like shape;

burying a conductive film in the dummy trench via a gate insulating film to serve as a dummy electrode, and burying a conductive film in the gate trench via the gate insulating film to serve as a gate electrode;

forming a projection for testing connected to the dummy electrode via an opening of the U-like shape, and forming a wiring layer for testing connected to the projection for testing; and testing an insulating property of the gate insulating film in the dummy trench by applying a voltage between the wiring layer for testing and a bottom surface of the charge transport region.

7. The method of claim 6, further comprising, after testing the insulating property, forming a gate surface wiring layer covering the wiring layer for testing and connected to the gate electrode, and separating the wiring layer for testing and the projection for testing.

8. The method of claim 6, wherein the dummy trench and the gate trench have stripes extending parallel to each other and having a continuous arrangement in a direction perpendicular to the extending direction of the stripes.

9. The method of claim 8, wherein:

two sets of the dummy trench and the gate trench having the continuous arrangement in the direction perpendicular to the extending direction are provided in rows such that the gate surface wiring layer having a stripe-shape extending parallel to the perpendicular direction is interposed between the two rows; and ends of the gate trench in the respective rows are connected to each other in the extending direction.

10. The method of claim 6, wherein the gate trench has a plurality of U-like shapes alternately inverted and connected to each other in the planar pattern, and is delineated between a plurality of dummy trenches so as to have a meandering line surrounding the dummy trenches into the U-like shapes.

11. The method of claim 6, wherein the dummy trench has an O-like or I-like shape.

* * * * *